US009536815B2

(12) United States Patent
Rathburn

(10) Patent No.: US 9,536,815 B2
(45) Date of Patent: Jan. 3, 2017

(54) SEMICONDUCTOR SOCKET WITH DIRECT SELECTIVE METALIZATION

(71) Applicant: HSIO TECHNOLOGIES, LLC, Maple Grove, MN (US)

(72) Inventor: James Rathburn, Maple Grove, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 118 days.

(21) Appl. No.: 14/408,338

(22) PCT Filed: Mar. 14, 2013

(86) PCT No.: PCT/US2013/031395
§ 371 (c)(1),
(2) Date: Dec. 16, 2014

(87) PCT Pub. No.: WO2014/011232
PCT Pub. Date: Jan. 16, 2014

(65) Prior Publication Data
US 2015/0279768 A1    Oct. 1, 2015

Related U.S. Application Data

(63) Continuation-in-part of application No. 13/266,486, filed as application No. PCT/US2010/036043 on May
(Continued)

(51) Int. Cl.
*H01R 12/00*    (2006.01)
*H01L 23/498*    (2006.01)
(Continued)

(52) U.S. Cl.
CPC ....... *H01L 23/49811* (2013.01); *H01L 21/486* (2013.01); *H01L 21/4857* (2013.01);
(Continued)

(58) Field of Classification Search
CPC .............. H01R 23/722; H01R 13/2435; H01R 13/2414; H01L 2914/01078
(Continued)

(56) References Cited

U.S. PATENT DOCUMENTS 3,672,986 A    6/1972    Schneble et al.
4,188,438 A    2/1980    Burns
(Continued)

FOREIGN PATENT DOCUMENTS

JP    2003/217774    7/2003
WO    WO 91/14015    9/1991
(Continued)

OTHER PUBLICATIONS

Notice of Allowance and Fee(s) Due mailed Apr. 9, 2015 in co-pending U.S. Appl. No. 13/266,573, now issued as U.S. Pat. No. 9,054,097.
(Continued)

*Primary Examiner* — Hien Vu

(57) ABSTRACT

A semiconductor socket including a substrate with a plurality of through holes extending from a first surface to a second surface. A conductive structure is disposed within the through holes A plurality of discrete contact members are located in the plurality of the through holes, within the conductive structure. The plurality of contact members each include a proximal end accessible from the second surface, and a distal end extending above the first surface. The conductive structure can be electrically coupled to circuit geometry. At least one dielectric layer is bonded to the second surface of the substrate with recesses corresponding to desired circuit geometry. A conductive material deposited in at least a portion of the recesses to form conductive traces redistributing terminal pitch of the proximal ends of the contact members.

12 Claims, 13 Drawing Sheets

Related U.S. Application Data 25, 2010, said application No. PCT/US2013/031395 is a continuation-in-part of application No. 13/319,158, filed as application No. PCT/US2010/038606 on Jun. 15, 2010, now Pat. No. 9,320,144, said application No. PCT/US2013/031395 is a continuation-in-part of application No. 13/410,914, filed on Mar. 2, 2012, now Pat. No. 9,276,336.

(60) Provisional application No. 61/670,765, filed on Jul. 12, 2012, provisional application No. 61/181,937, filed on May 28, 2009, provisional application No. 61/187,873, filed on Jun. 17, 2009, provisional application No. 61/448,288, filed on Mar. 2, 2011.

(51) Int. Cl.
| | |
|---|---|
| *H01L 23/64* | (2006.01) |
| *H01L 25/065* | (2006.01) |
| *H01L 23/522* | (2006.01) |
| *H01L 21/48* | (2006.01) |
| *H01L 23/66* | (2006.01) |
| *H01L 23/00* | (2006.01) |
| *H01L 23/50* | (2006.01) |

(52) U.S. Cl.
CPC .. *H01L 23/49822* (2013.01); *H01L 23/49827* (2013.01); *H01L 23/49838* (2013.01); *H01L 23/49861* (2013.01); *H01L 23/5222* (2013.01); *H01L 23/642* (2013.01); *H01L 23/66* (2013.01); *H01L 24/72* (2013.01); *H01L 25/0657* (2013.01); *H01L 23/50* (2013.01); *H01L 24/16* (2013.01); *H01L 2223/6616* (2013.01); *H01L 2223/6666* (2013.01); *H01L 2223/6677* (2013.01); *H01L 2224/05568* (2013.01); *H01L 2224/05573* (2013.01); *H01L 2224/16225* (2013.01); *H01L 2224/16227* (2013.01); *H01L 2224/81192* (2013.01); *H01L 2224/81385* (2013.01); *H01L 2224/81801* (2013.01); *H01L 2224/81901* (2013.01); *H01L 2225/06517* (2013.01); *H01L 2225/06527* (2013.01); *H01L 2225/06531* (2013.01); *H01L 2225/06572* (2013.01); *H01L 2924/00014* (2013.01); *H01L 2924/12042* (2013.01); *Y10T 29/49204* (2015.01)

(58) Field of Classification Search
USPC .......................................... 439/66, 81, 607.1
See application file for complete search history.

(56) References Cited

U.S. PATENT DOCUMENTS

| | | | |
|---|---|---|---|
| 4,295,700 | A | 10/1981 | Sado |
| 4,489,999 | A | 12/1984 | Miniet |
| 4,922,376 | A | 5/1990 | Pommer et al. |
| 4,964,948 | A | 10/1990 | Reed |
| 5,014,159 | A | 5/1991 | Butt |
| 5,071,363 | A | 12/1991 | Reylek et al. |
| 5,072,520 | A | 12/1991 | Nelson |
| 5,096,426 | A | 3/1992 | Simpson et al. |
| 5,127,837 | A | 7/1992 | Shah et al. |
| 5,129,573 | A | 7/1992 | Duffey |
| 5,161,983 | A | 11/1992 | Ohno |
| 5,167,512 | A | 12/1992 | Walkup |
| 5,208,068 | A | 5/1993 | Davis et al. |
| 5,237,203 | A | 8/1993 | Massaron |
| 5,246,880 | A | 9/1993 | Reele et al. |
| 5,286,680 | A | 2/1994 | Cain |
| 5,334,029 | A | 8/1994 | Akkapeddi et al. |
| 5,358,621 | A | 10/1994 | Oyama |
| 5,378,981 | A | 1/1995 | Higgins, III |
| 5,419,038 | A | 5/1995 | Wang et al. |
| 5,454,161 | A | 10/1995 | Beilin et al. |
| 5,479,319 | A | 12/1995 | Werther et al. |
| 5,509,019 | A | 4/1996 | Yamamura |
| 5,527,998 | A | 6/1996 | Anderson et al. |
| 5,534,787 | A * | 7/1996 | Levy ................. G01R 1/07314 324/754.09 |
| 5,562,462 | A | 10/1996 | Matsuba et al. |
| 5,596,178 | A * | 1/1997 | Christian ............... H05K 3/225 174/262 |
| 5,659,181 | A | 8/1997 | Bridenbaugh |
| 5,674,595 | A | 10/1997 | Busacco et al. |
| 5,691,041 | A | 11/1997 | Frankeny et al. |
| 5,716,663 | A | 2/1998 | Capote et al. |
| 5,741,624 | A | 4/1998 | Jeng et al. |
| 5,746,608 | A | 5/1998 | Taylor |
| 5,761,801 | A | 6/1998 | Gebhardt et al. |
| 5,764,485 | A | 6/1998 | Lebaschi |
| 5,772,451 | A * | 6/1998 | Dozier, II ............ B23K 20/004 257/E21.503 |
| 5,785,538 | A | 7/1998 | Beaman et al. |
| 5,787,976 | A | 8/1998 | Hamburgen et al. |
| 5,802,699 | A | 9/1998 | Fjelstad et al. |
| 5,802,711 | A | 9/1998 | Card et al. |
| 5,819,579 | A | 10/1998 | Roberts |
| 5,904,546 | A | 5/1999 | Wood et al. |
| 5,913,109 | A | 6/1999 | Distefano et al. |
| 5,921,786 | A | 7/1999 | Slocum et al. |
| 5,925,931 | A | 7/1999 | Yamamoto |
| 5,933,558 | A | 8/1999 | Sauvageau et al. |
| 5,973,394 | A | 10/1999 | Slocum et al. |
| 6,020,597 | A | 2/2000 | Kwak |
| 6,062,879 | A | 5/2000 | Beaman et al. |
| 6,080,932 | A | 6/2000 | Smith et al. |
| 6,107,109 | A | 8/2000 | Akram et al. |
| 6,114,240 | A | 9/2000 | Akram et al. |
| 6,118,426 | A | 9/2000 | Albert |
| 6,120,588 | A | 9/2000 | Jacobson |
| 6,137,687 | A | 10/2000 | Shirai et al. |
| 6,172,879 | B1 | 1/2001 | Cilia et al. |
| 6,177,921 | B1 | 1/2001 | Comiskey |
| 6,178,540 | B1 | 1/2001 | Lo et al. |
| 6,181,144 | B1 | 1/2001 | Hembree et al. |
| 6,200,143 | B1 | 3/2001 | Haba et al. |
| 6,207,259 | B1 | 3/2001 | Iino et al. |
| 6,225,692 | B1 | 5/2001 | Hinds |
| 6,247,938 | B1 | 6/2001 | Rathburn |
| 6,252,564 | B1 | 6/2001 | Albert |
| 6,255,126 | B1 | 7/2001 | Mathieu et al. |
| 6,263,566 | B1 | 7/2001 | Hembree et al. |
| 6,270,363 | B1 | 8/2001 | Brofman et al. |
| 6,288,451 | B1 | 9/2001 | Tsao |
| 6,312,971 | B1 | 11/2001 | Amundson |
| 6,313,528 | B1 | 11/2001 | Solberg |
| 6,320,256 | B1 | 11/2001 | Ho |
| 6,350,386 | B1 | 2/2002 | Lin |
| 6,359,790 | B1 | 3/2002 | Meyer-Berg |
| 6,413,790 | B1 | 7/2002 | Duthaler |
| 6,422,687 | B1 | 7/2002 | Jacobson |
| 6,428,328 | B2 | 8/2002 | Haba et al. |
| 6,437,452 | B2 | 8/2002 | Lin |
| 6,437,591 | B1 | 8/2002 | Farnworth et al. |
| 6,459,418 | B1 | 10/2002 | Comiskey |
| 6,461,183 | B1 | 10/2002 | Ohkita |
| 6,462,418 | B2 | 10/2002 | Sakamoto et al. |
| 6,462,568 | B1 | 10/2002 | Cram |
| 6,477,286 | B1 | 11/2002 | Ouchi |
| 6,490,786 | B2 | 12/2002 | Belke et al. |
| 6,494,725 | B2 | 12/2002 | Lin et al. |
| 6,506,438 | B2 | 1/2003 | Duthaler et al. |
| 6,521,489 | B2 | 2/2003 | Duthaler |
| 6,545,291 | B1 | 4/2003 | Amundson |
| 6,572,396 | B1 | 6/2003 | Rathburn |
| 6,574,114 | B1 | 6/2003 | Brindle et al. |
| 6,593,535 | B2 | 7/2003 | Gailus |
| 6,603,080 | B2 | 8/2003 | Jensen |
| 6,614,104 | B2 | 9/2003 | Farnworth et al. |
| 6,626,526 | B2 | 9/2003 | Ueki |

(56) References Cited

U.S. PATENT DOCUMENTS

| | | |
|---|---|---|
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 * | 12/2004 | Rathburn ............ G01R 1/0735 439/66 |
| 6,840,777 B2 | 1/2005 | Sathe et al. |
| 6,853,087 B2 | 2/2005 | Neuhaus et al. |
| 6,856,151 B1 | 2/2005 | Cram |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,049,838 B2 * | 5/2006 | Kagami ............ G01R 1/06722 324/755.04 |
| 7,064,412 B2 | 6/2006 | Geissinger et al. |
| 7,070,419 B2 | 7/2006 | Brown et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,536,714 B2 | 5/2009 | Yuan |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,955,088 B2 | 6/2011 | Di Stefano |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakaguchi |
| 8,536,889 B2 | 9/2013 | Nelson et al. |
| 8,610,265 B2 | 12/2013 | Rathburn |
| 8,618,649 B2 | 12/2013 | Rathburn |
| 8,758,067 B2 * | 6/2014 | Rathburn ............... H01R 12/52 439/66 |
| 8,789,272 B2 | 7/2014 | Rathburn |
| 8,803,539 B2 | 8/2014 | Rathburn |
| 8,829,671 B2 | 9/2014 | Rathburn |
| 8,911,266 B2 * | 12/2014 | Kawate ............... G01R 1/0483 439/700 |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 2001/0012707 A1 | 8/2001 | Ho et al. |
| 2001/0016551 A1 | 8/2001 | Yushio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |

(56) References Cited

U.S. PATENT DOCUMENTS

| | | |
|---|---|---|
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsunami |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Anderson et al. |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0265919 A1 | 11/2006 | Huang |
| 2006/0281303 A1 | 12/2006 | Trezza et al. |
| 2007/0021002 A1 | 1/2007 | Laurx et al. |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0013901 A1 | 1/2015 | Rathburn |
| 2015/0091600 A1 | 4/2015 | Rathburn |

(56) References Cited

U.S. PATENT DOCUMENTS

| | | |
|---|---|---|
| 2015/0136467 A1 | 5/2015 | Rathburn |
| 2015/0162678 A1 | 6/2015 | Rathburn |
| 2015/0181710 A1 | 6/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |
| WO | WO 2014/011228 | 1/2014 |
| WO | WO 2014/011232 | 1/2014 |
| WO | WO-2015/006393 | 1/2015 |

OTHER PUBLICATIONS

Notice of Allowance and Fee(s) Due mailed Apr. 13, 2015 in co-pending U.S. Appl. No. 13/318,200, now published as US Patent Application Publication No. US 2012/0056332.
Notice of Allowance and Fee(s) Due mailed May 18, 2015 in co-pending U.S. Appl. No. 14/086,029, now issued as U.S. Pat. No. 9,076,884.
Final Office Action mailed Jun. 30, 2015 in co-pending U.S. Appl. No. 13/318,369, now published as US Patent Application Publication No. US 2012/0043119.
Office Action mailed Apr. 23, 2015 in co-pending U.S. Appl. No. 13/319,158, now published as US Patent Application Publication No. 2012/0051016.
Office Action mailed Apr. 2, 2015 in co-pending U.S. Appl. No. 13/700,639, now published as US Patent Application Publication No. 2013/0078860.
Final Office Action mailed Apr. 23, 2015 in co-pending U.S. Appl. No. 13/879,783, now published as US Patent Application Publication No. 2013/0223034.
Notice of Allowance and Fee(s) Due mailed May 28, 2015 in co-pending U.S. Appl. No. 13/879,883, now published as US Patent Application Publication No. 2013/0244490.
Office Action mailed May 22, 2015 in co-pending U.S. Appl. No. 13/880,231, now published as US Patent Application Publication No. 2013/0210276.
Office Action mailed May 4, 2015 in co-pending U.S. Appl. No. 13/880,231, now published as US Patent Application Publication No. 2013/0210276.
Notice of Allowance and Fee(s) Due mailed Jun. 4, 2015 in co-pending U.S. Appl. No. 13/410,914, now published as US Patent Application Publication No. US 2012/0164888.
Notification of Transmittal of the International Search Report and the Written Opinion of the International Searching Authority mailed Jul. 30, 2010 in International Application No. PCT/US2010/036043.
Notification of Transmittal of the International Search Report and the Written Opinion of the International Searching Authority mailed Jul. 21, 2010 in International Application No. PCT/US2010/036047.
Notification of Transmittal of the International Search Report and the Written Opinion of the International Searching Authority mailed Jul. 28, 2010 in International Application No. PCT/US2010/036363.
Notification of Transmittal of the International Search Report and the Written Opinion of the International Searching Authority mailed Jul. 28, 2010 in International Application No. PCT/US2010/036377.
Notification of Transmittal of the International Search Report and the Written Opinion of the International Searching Authority mailed Jul. 30, 2010 in International Application No. PCT/US2010/036388.
Notification of Transmittal of the International Search Report and the Written Opinion of the International Searching Authority mailed Jul. 27, 2010 in International Application No. PCT/US2010/036397.
Notification of Transmittal of the International Search Report and the Written Opinion of the International Searching Authority mailed Jul. 30, 2010 in International Application No. PCT/US2010/036055.
Notification of Transmittal of the International Search Report and the Written Opinion of the International Searching Authority mailed Aug. 4, 2010 in International Application No. PCT/US2010/036288.
Notification of Transmittal of the International Search Report and the Written Opinion of the International Searching Authority mailed Aug. 4, 2010 in International Application No. PCT/US2010/036285.
Notification of Transmittal of the International Search Report and the Written Opinion of the International Searching Authority mailed Jul. 30, 2010 in International Application No. PCT/US2010/036282.
Notification of Transmittal of the International Search Report and the Written Opinion of the International Searching Authority mailed Jul. 30, 2010 in International Application No. PCT/US2010/036295.
Notification of Transmittal of the International Search Report and the Written Opinion of the International Searching Authority mailed Jul. 30, 2010 in International Application No. PCT/US2010/036313.
Notification of Transmittal of the International Search Report and the Written Opinion of the International Searching Authority mailed Aug. 3, 2010 in International Application No. PCT/US2010/037619.
Notification of Transmittal of the International Search Report and the Written Opinion of the International Searching Authority mailed Sep. 7, 2010 in International Application No. PCT/US2010/038600.
Notification of Transmittal of the International Search Report and the Written Opinion of the International Searching Authority mailed Aug. 18, 2010 in International Application No. PCT/US2010/038606.
Notification of Transmittal of the International Search Report and the Written Opinion of the International Searching Authority mailed Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority mailed Apr. 14, 2011 in International Application No. PCT/US2011/023138.

(56) References Cited

OTHER PUBLICATIONS

Notification of Transmittal of the International Search Report and the Written Opinion of the International Searching Authority mailed Aug. 17, 2011 in International Application No. PCT/US2011/033726.
Notification of Transmittal of the International Search Report and the Written Opinion of the International Searching Authority mailed Sep. 27, 2011 in International Application No. PCT/US2011/038845.
Notification of Transmittal of the International Search Report and the Written Opinion of the International Searching Authority mailed Feb. 8, 2012 in International Application No. PCT/US2011/056664.
Notification of Transmittal of the International Search Report and the Written Opinion of the International Searching Authority mailed Mar. 26, 2012 in International Application No. PCT/US2011/062313.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Notification of Transmittal of the International Search Report and the Written Opinion of the International Searching Authority mailed Jun. 3, 2013 in International Application No. PCT/US2013/031395.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Oct. 27, 2014 in International Application No. PCT/US2014/045856.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated with Inkjet Printing Technique," Solid-State Electronics, vol. 47, pp. 1543-1548 (2003).
Print—Definition of Print by the Free Dictionary, http://www.thefreedictionary.com/print, Aug. 13, 2014.
Restriction Requirement mailed Jun. 13, 2013 in co-pending U.S. Appl. No. 13/266,486, now published as US Patent Application Publication No. US 2012/0055701.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Final Office Action mailed May 15, 2014 in co-pending U.S. Appl. No. 13/266,486, now published as US Patent Application Publication No. US 2012/0055701.
Amendment and Response Under Rule 1.116 filed Jul. 10, 2014 in co-pending U.S. Appl. No. 13/266,486, now published as US Patent Application Publicatoin No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Ex Parte Quayle Action mailed Oct. 1, 2014 in co-pending U.S. Appl. No. 13/266,486, now published as US Patent Application Publication No. US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now issued as U.S. Pat. No. 8,803,539.
Restriction Requirement mailed Oct. 1, 2013 in co-pending U.S. Appl. No. 13/319,145, now published as US Patent Application Publication No. 2012/0049342.
Response to Restriction Requirement filed Oct. 4, 2013 in co-pending U.S. Appl. No. 13/319,145, now published as US Patent Application Publication No. 2012/0049342.
Office Action mailed Dec. 26, 2013 in co-pending U.S. Appl. No. 13/319,145, now published as US Patent Application Publication No. 2012/0049342.
Amendment and Response filed Mar. 18, 2014 in co-pending U.S. Appl. No. 13/319,145, now published as US Patent Application Publication No. 2012/0049342.
Final Office Action mailed Aug. 4, 2014 in co-pending U.S. Appl. No. 13/319,145, now published as US Patent Application Publication No. 2012/0049342.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Notice of Allowance and Fee(s) Due mailed Dec. 19, 2014 in co-pending U.S. Appl. No. 13/319,145 now published as US Patent Application Publication No. US 2012/0049342.
Office Action mailed Nov. 22, 2013 in co-pending U.S. Appl. No. 13/266,907, now issued as U.S. Pat. No. 8,928,344.
Amendment and Response filed Jan. 3, 2014 in co-pending U.S. Appl. No. 13/266,907, now issued as U.S. Pat. No. 8,928,344.

(56) References Cited

OTHER PUBLICATIONS

Supplemental Amendment and Response filed Jan. 29, 2014 in co-pending U.S. Appl. No. 13/266,907, now issued as U.S. Pat. No. 8,928,344.
Final Office Action mailed May 7, 2014 in co-pending U.S. Appl. No. 13/266,907, now issued as U.S. Pat. No. 8,928,344.
Amendment and Response Under Rule 1.116 mailed Jul. 10, 2014 in co-pending U.S. Appl. No. 13/266,907, now issued as U.S. Pat. No. 8,928,344.
Advisory Action mailed Jul. 25, 2014 in co-pending U.S. Appl. No. 13/266,907, now issued as U.S. Pat. No. 8,928,344.
Advisory Action mailed Aug. 8, 2014 in co-pending U.S. Appl. No. 13/266,907, now issued as U.S. Pat. No. 8,928,344.
Amendment and Response to Final Office Action and RCE filed Aug. 26, 2014 in co-pending U.S. Appl. No. 13/266,907, now issued as U.S. Pat. No. 8,928,344.
Notice of Allowance and Fee(s) Due mailed Oct. 8, 2014 in co-pending U.S. Appl. No. 13/266,907, now issued as U.S. Pat. No. 8,928,344.
Office Action mailed Jan. 3, 2014 in co-pending U.S. Appl. No. 13/318,038, now issued as U.S. Pat. No. 8,912,812.
Amendment and Response and Terminal Disclaimer filed Apr. 2, 2014 in co-pending U.S. Appl. No. 13/318,038, now issued as U.S. Pat. No. 8,912,812.
Terminal Disclaimer Review Decision mailed Apr. 2, 2014 in co-pending U.S. Appl. No. 13/318,038, now issued as U.S. Pat. No. 8,912,812.
Final Office Action mailed Aug. 1, 2014 in co-pending U.S. Appl. No. 13/318,038, now issued as U.S. Pat. No. 8,912,812.
Amendment and Response Under Rule 1.116 and Termination Disclaimer filed Sep. 4, 2014 in co-pending U.S. Appl. No. 13/318,038, now issued as U.S. Pat. No. 8,912,812.
Terminal Disclaimer Review Decision mailed Sep. 8, 2014 in co-pending U.S. Appl. No. 13/318,038, now issued as U.S. Pat. No. 8,912,812.
Notice of Allowance and Fee(s) Due mailed Sep. 30, 2014 in co-pending U.S. Appl. No. 13/318,038, now issued as U.S. Pat. No. 8,912,812.
Restriction Requirement mailed Dec. 9, 2013 in co-pending U.S. Appl. No. 13/318,171, now issued as U.S. Pat. No. 8,789,272.
Response to Restriction Requirement filed Dec. 17, 2013 in co-pending U.S. Appl. No. 13/318,171, now issued as U.S. Pat. No. 8,789,272.
Office Action mailed Feb. 14, 2014 in co-pending U.S. Appl. No. 13/318,171, now issued as U.S. Pat. No. 8,789,272.
Amendment and Response filed Feb. 26, 2014 in co-pending U.S. Appl. No. 13/318,171, now issued as U.S. Pat. No. 8,789,272.
Notice of Allowance and Fee(s) Due mailed Mar. 14, 2014 in co-pending U.S. Appl. No. 13/318,171, now issued as U.S. Pat. No. 8,789,272.
Restriction Requirement mailed Dec. 9, 2013 in co-pending U.S. Appl. No. 13/318,181, now published as US Patent Application Publication No. US 2012/0044659.
Response to Restriction Requirement filed Jan. 28, 2014 in co-pending U.S. Appl. No. 13/318,181, now published as US Patent Application Publication No. US 2012/0044659.
Office Action mailed Apr. 21, 2014 in co-pending U.S. Appl. No. 13/318,181, now published as US Patent Application Publication No. US 2012/0044659.
Amendment and Response filed Jul. 27, 2014 in co-pending U.S. Appl. No. 13/318,181, now published as US Patent Application Publication No. US 2012/0044659.
Notice of Allowance and Fee(s) Due mailed Oct. 24, 2014 in co-pending U.S. Appl. No. 13/318,181, now published as US Patent Application Publication No. US 2012/0044659.
Supplemental Notice of Allowance mailed Dec. 19, 2014 in co-pending U.S. Appl. No. 13/318,181, now published as US Patent Application Publication No. US 2012/0044659.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 2013 in co-pending U.S. Appl. No. 13/318,200, now published as US Patent Application Publication No. US 2012/0056332.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Office Action mailed Nov. 19, 2014 in co-pending U.S. Appl. No. 13/318,200, now published as US Patent Application Publication No. US 2012/0056332.
Office Action mailed Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
RCE filed Mar. 10, 2014 in co-pending U.S. Appl. No. 13/320,285, now published as US Patent Application Publication No. US 2012/0055702.
Office Action mailed Jul. 29, 2014 in co-pending U.S. Appl. No. 13/320,285, now published as US Patent Application Publication No. US 2012/0055702.
Amendment and Response and Examiner's Interview Summary filed Oct. 15, 2014 in co-pending U.S. Appl. No. 13/320,285, now published as US Patent Application Publication No. US 2012/0055702.

(56) References Cited

OTHER PUBLICATIONS

Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Office Action mailed Nov. 14, 2014 in co-pending U.S. Appl. No. 13/318,369, now published as US Patent Application Publication No. US 2012/0043119.
Office Action mailed Aug. 26, 2014 in co-pending U.S. Appl. No. 13/318,382, now published as US Patent Application Publication No. US 2012/0043130.
Amendment and Response and Terminal Disclaimer filed Nov. 14, 2014 in co-pending U.S. Appl. No. 13/318,382, now published as US Patent Application Publication No. US 2012/0043130.
Restriction Requirement mailed Sep. 26, 2013 in co-pending U.S. Appl. No. 13/319,120 now published as US Patent Application Publication No. US 2012/0061851.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Jan. 17, 2014 in co-pending U.S. Appl. No. 13/319,120 now published as US Patent Application Publication No. US 2012/0061851.
Amendment and Response filed Apr. 16, 2014 in co-pending U.S. Appl. No. 13/319,120 now published as US Patent Application Publication No. US 2012/0061851.
Final Office Action mailed Jul. 31, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,120 now published as US Patent Application Publication No. US 2012/0061851.
Amendment and Response and Rce filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Jun. 27, 2014 in co-pending U.S. Appl. No. 13/319,158, now published as US Patent Application Publication No. 2012/0051016.
Amendment and Response filed Sep. 3, 2014 in co-pending U.S. Appl. No. 13/319,158, now published as US Patent Application Publication No. 2012/0051016.
Final Office Action mailed Nov. 6, 2014 in co-pending U.S. Appl. No. 13/319,158, now published as US Patent Application Publication No. 2012/0051016.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.

Office Action mailed Feb. 27, 2014 in co-pending U.S. Appl. No. 13/319,203, now published as US Patent Application Publication No. 2012/0056640.
Amendment and Response filed Jun. 10, 2014 in co-pending U.S. Appl. No. 13/319,203, now published as US Patent Application Publication No. 2012/0056640.
Final Office Action mailed Aug. 20, 2014 in co-pending U.S. Appl. No. 13/319,203, now published as US Patent Application Publication No. 2012/0056640.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Response to Restriction Requirement filed Oct. 4, 2013 in co-pending U.S. Appl. No. 13/266,573, now published as US Patent Application Publication No. 2012/0061846.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Office Action mailed Jul. 3, 2014 in co-pending U.S. Appl. No. 13/266,573, now published as US Patent Application Publication No. 2012/0061846.
Amendment and Response filed Sep. 9, 2014 in co-pending U.S. Appl. No. 13/266,573, now published as US Patent Application Publication No. 2012/0061846.
Examiner-Initiated Interview Summary mailed Mar. 14, 2013 in co-pending U.S. Appl. No. 13/319,228, now published as US Patent Application Publication No. US 2012/0058653.
Restriction Requirement mailed Apr. 23, 2014 in co-pending U.S. Appl. No. 13/319,228, now published as US Patent Application Publication No. US 2012/0058653.
Response to Restriction Requirement filed Jun. 23, 2014 in co-pending U.S. Appl. No. 13/319,228, now published as US Patent Application Publication No. US 2012/0058653.
Office Action mailed Sep. 4, 2014 in co-pending U.S. Appl. No. 13/319,228, now published as US Patent Application Publication No. US 2012/0058653.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Restriction Requirement mailed Feb. 7, 2014 in co-pending U.S. Appl. No. 13/575,368, now published as US Patent Application Publication No. 2012/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.

(56) References Cited

OTHER PUBLICATIONS

Amendment and Response filed Nov. 19, 2014 in co-pending U.S. Appl. No. 13/643,436, now published as US Patent Application Publication No. 2013/0105984.
Office Action mailed Apr. 24, 2014 in co-pending U.S. Appl. No. 13/700,639, now published as US Patent Application Publication No. 2013/0078860.
Amendment and Response filed Jul. 30, 2014 in co-pending U.S. Appl. No. 13/700,639, now published as US Patent Application Publication No. 2013/0078860.
Final Office Action mailed Sep. 8, 2014 in co-pending U.S. Appl. No. 13/700,639, now published as US Patent Application Publication No. 2013/0078860.
Response Under Rule 1.116 filed Nov. 11, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Restriction Requirement mailed Jun. 5, 2014 in co-pending U.S. Appl. No. 13/879,783, now published as US Patent Application Publication No. 2013/0223034.
Response to Restriction Requirement filed Jul. 17, 2014 in co-pending U.S. Appl. No. 13/879,783, now published as US Patent Application Publication No. 2013/0223034.
Office Action mailed Oct. 6, 2014 in co-pending U.S. Appl. No. 13/879,783, now published as US Patent Application Publication No. 2013/0223034.
Office Action mailed Nov. 17, 2014 in co-pending U.S. Appl. No. 13/879,883, now published as US Patent Application Publication No. 2013/0244490.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Dec. 16, 2013 in co-pending U.S. Appl. No. 13/410,914, now published as US Patent Application Publication No. US 2012/0164888.
Amendment and Response filed Mar. 17, 2014 in co-pending U.S. Appl. No. 13/410,914, now published as US Patent Application Publication No. US 2012/0164888.
Final Office Action mailed Jun. 4, 2014 in co-pending U.S. Appl. No. 13/410,914, now published as US Patent Application Publication No. US 2012/0164888.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Amendment and Response and RCE filed Sep. 30, 2014 in co-pending U.S. Appl. No. 13/410,914, now published as US Patent Application Publication No. US 2012/0164888.
Office Action mailed Dec. 26, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Notice of Allowance and Fee(s) Due mailed Feb. 26, 2014 in co-pending U.S. Appl. No. 13/412,870, now published as US Patent Application Publication No. US 2012/0171907.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed Sep. 16, 2013 in co-pending U.S. Appl. No. 13/413,724, now published as US Patent Application Publication No. US 2012/0168948.
Amendment and Response filed Nov. 20, 2013 in co-pending U.S. Appl. No. 13/413,724, now published as US Patent Application Publication No. US 2012/0168948.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Notice of Allowance and Fee(s) Due mailed May 9, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Amendment and Response filed Aug. 26, 2014 in co-pending U.S. Appl. No. 13/418,853, now published as US Patent Application Publication No. US 2012/0244728.
Final Office Action mailed Oct. 28, 2014 in co-pending U.S. Appl. No. 13/418,853, now published as US Patent Application Publication No. US 2012/0244728.
Notice of Allowance and Fee(s) Due mailed Oct. 2, 2013 in co-pending U.S. Appl. No. 13/448,865, now published as US Patent Application Publication No. US 2012/0199985.
Notice of Allowance and Fee(s) Due mailed Dec. 6, 2013 in co-pending U.S. Appl. No. 14/058,863, now published as US Patent Application Publication No. 2014/0043782.

(56) References Cited

OTHER PUBLICATIONS

Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notice of Allowance and Fee(s) Due mailed Jul. 28, 2013 in co-pending U.S. Appl. No. 13/448,914, now published as US Patent Application Publication No. US 2012/0202364.
Office Action mailed Oct. 7, 2013 in co-pending U.S. Appl. No. 13/969,953, now issued as U.S. Pat. No. 8,704,377.
Amendment and Response and Terminal Disclaimer filed Nov. 20, 2013 in co-pending U.S. Appl. No. 13/969,953, now issued as U.S. Pat. No. 8,704,377.
Final Office Action mailed Dec. 20, 2013 in co-pending U.S. Appl. No. 13/969,953, now issued as U.S. Pat. No. 8,704,377.
Amendment and Response to Final Office filed Dec. 30, 2013 in co-pending U.S. Appl. No. 13/969,953, now issued as U.S. Pat. No. 8,704,377.
Notice of Allowance and Fee(s) Due mailed Jan. 22, 2014 in co-pending U.S. Appl. No. 13/969,953, now issued as U.S. Pat. No. 8,704,377.
Co-pending U.S. Appl. No. 14/327,916 titled Matrix Defined Electrical Circuit Structure, filed Jul. 10, 2014.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/565,724 titled Performance Enhanced Semiconductor Socket, filed Dec. 10, 2014.
Final Office Action mailed Mar. 16, 2015 in co-pending U.S. Appl. No. 13/320,285, now published as US Patent Application Publication No. US 2012/0055702.
Final Office Action mailed Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 13/319,158, now published as US Patent Application Publication No. US 2012/0051016.
Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 3/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action mailed Feb. 27, 2015 in co-pending U.S. Appl. No. 13/410,943, now published as US Patent Application Publication No. US 2012/0161317.
Amendment and Response with Rce filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.

* cited by examiner

Semiconductor Socket with Direct Selective Metalization

SEMICONDUCTOR SOCKET WITH DIRECT SELECTIVE METALIZATION

CROSS-REFERENCE TO RELATED APPLICATIONS

This application claims the benefit of a national stage application under 35 U.S.C. §371 of International Application No. PCT/US2013/031395, titled SEMICONDUCTOR SOCKET WITH DIRECT SELECTIVE METALIZATION, filed Mar. 14, 2013, which claims priority to U.S. Provisional Application No. 61/670,765, filed Jul. 12, 2012, all of which are hereby incorporated by reference in their entireties.

This application is a continuation-in-part of U.S. patent application Ser. No. 13/266,486, entitled HIGH PERFORMANCE SURFACE MOUNT ELECTRICAL INTERCONNECT, filed Oct. 27, 2011, which is a national stage application under 35 U.S.C. §371 of International Application No. PCT/US2010/036043, titled HIGH PERFORMANCE SURFACE MOUNT ELECTRICAL INTERCONNECT, filed May 25, 2010, which claims priority to U.S. Provisional Application No. 61/181,937, filed May 28, 2009, all of which are hereby incorporated by reference in their entireties.

This application is a continuation-in-part of U.S. patent application Ser. No. 13/319,158, entitled SEMICONDUCTOR SOCKET, filed Nov. 7, 2011, which is a national stage application under 35 U.S.C. §371 of International Application No. PCT/US2010/038606, titled SEMICONDUCTOR SOCKET, filed Jun. 15, 2010, which claims priority to U.S. Provisional Application No. 61/187,873, filed Jun. 17, 2009, all of which are hereby incorporated by reference in their entireties.

This application is a continuation-in-part of U.S. patent application Ser. No. 13/410,914, titled METALIZED PAD TO ELECTRICAL CONTACT INTERFACE, filed Mar. 2, 2012, which claims priority to U.S. Provisional Application No. 61/448,288, filed Mar. 2, 2011, both of which are hereby incorporated by reference in their entireties.

RELATED APPLICATION

This application claims the benefit of U.S. Provisional Application No. 61/670,765, filed Jul. 12, 2012, the disclosure of which is hereby incorporated by reference.

TECHNICAL FIELD

The present application relates to a high performance semiconductor socket that forms an electrical interconnect between an integrated circuit and another circuit member.

BACKGROUND OF THE INVENTION

Traditional integrated circuit (IC) sockets are generally constructed of an injection molded plastic insulator housing which has stamped and formed copper alloy contact members stitched or inserted into designated positions within the housing. The designated positions in the insulator housing are typically shaped to accept and retain the contact members. The assembled socket body is then generally processed through a reflow oven which melts and attaches solder balls to the base of the contact member. During final assembly, the socket can be mounted onto a printed circuit assembly. The printed circuit assembly may be a printed circuit board (printed circuit board), the desired interconnect positions on the printed circuit board are printed with solder paste or flux and the socket is placed such that the solder balls on the socket contacts land onto the target pads on the printed circuit board. The assembly is then reheated to reflow the solder balls on the socket assembly. When the solder cools it essentially welds the socket contacts to the printed circuit board, creating the electrical path for signal and power interaction with the system.

During use, the socket receives one or more IC packages and connects each terminal on the IC package to the corresponding terminal on the printed circuit board. The terminals on the IC package are held against the contact members by applying a load to the package, which is expected to maintain intimate contact and reliable circuit connection throughout the life of the system. No permanent connection is required so that the IC package can be removed or replaced without the need for reflowing solder connections.

These types of sockets and interconnects have been produced in high volume for many years. As systems advance to next generation architectures, these traditional devices have reached mechanical and electrical limitations that mandate alternate approaches.

As processors and electrical systems evolve, several factors have impacted the design of traditional sockets. Increased terminal count, reductions in the terminal pitch (i.e., the distance between the contacts), and signal integrity have been main drivers that impact the socket and contact design. As terminal count increases, the IC packages get larger due to the additional space needed for the terminals. As the IC package grows larger the relative flatness of the IC package and corresponding printed circuit board becomes more important. A certain degree of compliance is required between the contacts and the terminal pads to accommodate the topography differences and maintain reliable connections.

IC package manufacturers tend to drive the terminal pitch smaller so they can reduce the size of the IC package and reduce the flatness effects. As the terminal pitch reduces, however, the surface area available to place a contact is also reduced, which limits the space available to locate a spring or a contact member that can deflect without touching a neighbor.

In order to maximize the length of the spring so that it can deflect the proper amount without damage, the thickness of the insulating walls within the plastic housing is reduced. Thinner walls increase the difficulty of molding as well as the latent stress in the molded housing that can cause warping due to heat applied during solder reflow.

For mechanical reasons, longer contact members traditionally have been preferred because they have desirable spring properties. Long contact members, however, tend to reduce the electrical performance of the connection by creating a parasitic effect that impacts the signal as it travels through the contact. Other factors, such as contact resistance, impact self heating as current passes through, for example, power delivery contacts. Also, the small space between contact members can cause distortion as a nearby contact member influences a neighboring contact member, which is known as cross talk.

Traditional sockets and methods of fabricating the same are able to meet the mechanical compliance requirements of today's needs, but they have reached an electrical performance limit. Next generation systems will operate above 5 GHz and beyond and the existing interconnects will not achieve acceptable performance levels without significant revision.

BRIEF SUMMARY OF THE INVENTION

The present disclosure is directed to semiconductor sockets that enable next generation electrical performance. A semiconductor socket according to the present disclosure may include a substrate and a plurality of discrete contact members positioned and secured in a plurality of holes through the substrate. The holes through the substrate can be selectively metalized to add functions and electrical enhancements such as impedance tuning and/or shielding of the contact members within the socket housing. Some of the embodiments can include a high performance interconnect architecture within a socket.

The contact members can be simple beam structures made of conventional materials, but omit the normal retention features that add parasitic mass and distort or degrade the integrity of the signal as it passes through the contact member. This approach provides a reliable connection to the package terminals and creates a platform to add electrical and mechanical enhancements to the substrate of the socket to address the challenges of next generation interconnect requirements. The lack of contact member retention features greatly reduces the complexity of the contact members and the tooling required to produce them.

One embodiment is directed to a semiconductor socket including a substrate with a plurality of through holes extending from a first surface to a second surface. The through holes can be metalized, for example using dielectric deposition, to provide a conductive structure within individual through holes. The conductive structure can be electrically coupled to at least a portion of the circuitry.

A plurality of discrete contact members are located in the plurality of the through holes. The plurality of contact members each include a proximal end accessible from the second surface, and a distal end extending above the first surface. The conductive structure of a through hole can create a pseudo co-axial structure surrounding a desired contact member.

Conductive traces can be formed on a surface of the substrate. A dielectric layer can be bonded to a surface of the substrate with recesses corresponding to target circuit geometry. A conductive material deposited in at least a portion of the recesses can form the conductive traces redistributing terminal pitch of the proximal ends of the contact members. The conductive traces can preferably have substantially rectangular cross-sectional shapes. A conductive material, a non-conductive material, and a semi-conductive material can be deposited on a single layer using a process according to the present disclosure. The conductive traces can be electrically coupled to at least a portion of the circuitry, such as other conductive layers (e.g., a circuitry plane, a ground plane, a power plane or the like). The conductive traces can be electrically coupled to a conductive structure disposed within a through hole.

Conductive plating is optionally applied to at least a portion of the conductive traces. The conductive material can be one of sintered conductive particles or a conductive ink. A compliant material is optionally located between the substrate and at least a portion of the circuit geometry. The conductive plating can be electrically coupled to other conductive layers (e.g., a circuitry plane such as a ground plane or a power plane). The conductive plating can be electrically coupled to a conductive structure disposed within a through hole.

An electrical device can be printed on one of a dielectric layer or the substrate and electrically coupled to at least a portion of the circuit geometry. The at least one electrical device can be electrically coupled to, for example a conductive layer (e.g., a circuitry plane such as a ground plane or a power plane). The electrical device can be electrically coupled to a conductive structure disposed within a through hole and/or to conductive traces and/or conductive plating applied to the conductive traces.

The semiconductor socket optionally includes at least one external dielectric layer extending beyond the substrate. External routing on the external dielectric layer electrically couples to a portion of the circuit geometry. The external routing can be electrically coupled to one of a power management system, a ground plane, or another semiconductor socket.

The substrate is optionally a plurality of layers. In one embodiment, the substrate includes at least one additional circuitry plane. The additional circuitry plane can be one of a ground plane, a power plane, an electrical connection to other circuit members, a dielectric layer, a printed circuit board, a flexible circuit, a bare die device, an integrated circuit device, organic or inorganic substrates, or a rigid circuit.

The present disclosure is also directed to an electrical assembly including a semiconductor device electrically coupled to the distal ends of the contact members, and a circuit member with a plurality of contact pads electrically coupled to the proximal ends of the contact members. The circuit member can be one of a dielectric layer, a printed circuit board, a flexible circuit, a bare die device, an integrated circuit device, organic or inorganic substrates, or a rigid circuit.

The present disclosure is also directed to a method of forming a semiconductor socket. A plurality of through holes are formed in a substrate. The through holes can be metalized for example using dielectric deposition, to provide a conductive structure within individual through holes. A plurality of discrete contact members are inserted into the plurality of through holes in the substrate. The contact members include proximal ends accessible from a second surface of the substrate and distal ends extending above a first surface of the substrate. At least one dielectric layer is selectively deposited on the second surface of the substrate and imaged to create recesses corresponding to a target circuit geometry. A conductive material is deposited in a plurality of the recesses to form conductive traces redistributing terminal pitch of the proximal ends of the contact members. The conductive material is preferably electrolessly plated in the recesses. Conductive plating may be optionally applied to the conductive traces.

The substrate containing the contact members may be inverted to expose the proximal ends of the contact members that will electrically couple with the printed circuit board. This surface of the substrate and the array of exposed proximal ends of the contact members may be processed to achieve contact retention, to add mechanical features to improve the reliability of the solder joint to the printed circuit board, and to provide a platform to add passive and active circuit features to improve electrical performance or internal function and intelligence.

Once the substrate is loaded with contact members, the substrate can be processed as a printed circuit board or semiconductor package to add functions and electrical enhancements not found in traditional connectors. In one embodiment, electrical devices and conductive traces are plated onto the substrate using, for example, electro-less plating, inkjet printing technology, aerosol printing technology, or other printing technology. The ability to enhance the substrate such that it mimics aspects of the IC package and the printed circuit board allows for reductions in complexity for the IC package and the printed circuit board while improving the overall performance of the semiconductor socket.

The present process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The process is typically followed by a thermal treatment, such as in a furnace or with a laser, to achieve dense functionalized structures.

The use of processes disclosed herein permits the material set in a given layer to vary. Traditional printed circuit board and circuit fabrication methods take sheets of material and stack them up, laminate, and/or drill. The materials in each layer are limited to the materials in a particular sheet. Imaging the liquid dielectric permit a wide variety of materials to be applied on a layer with a registration relative to the features of the previous layer. Selective addition of conductive, non-conductive, or semi-conductive materials at precise locations to create a desired effect may have advantages in tuning impedance or adding electrical function on a given layer. Tuning performance on a layer by layer basis relative to the previous layer can greatly enhance electrical performance.

The present method and apparatus can permit dramatic simplification of the contact members and the substrate of the socket housing. The preferably featureless contact members reduce parasitic effects of additional metal features normally present for contact member retention. The present method and apparatus can be compatible with existing high volume manufacturing techniques. Adding functions to the socket housing permits reductions in the cost and complexity of the IC package and/or the printed circuit board.

In another embodiment, mechanical decoupling features are added to the contact member retention structure. The semiconductor socket can be configured to electrically and mechanically couple to contact pads on the printed circuit board, thereby reducing cost and eliminating at least one reflow cycle that can warp or damage the substrate.

DETAILED DESCRIPTION OF THE INVENTION

A semiconductor socket in accordance with the present disclosure permits fine contact-to-contact spacing (pitch) on the order of less than 1.0 millimeter ($1\times10^{-3}$ meter), and more preferably a pitch of less than about 0.7 millimeter, and most preferably a pitch of less than about 0.4 millimeter. Such fine pitch semiconductor sockets are especially useful for communications, wireless, and memory devices. The disclosed low cost, high signal performance semiconductor sockets, which have low profiles and can be soldered to the system PC board, are particularly useful for desktop and mobile PC applications.

The disclosed semiconductor sockets may permit IC devices to be installed and uninstalled without the need to reflow solder. The solder-free electrical connection of the IC devices is environmentally friendly.

Figure 1:
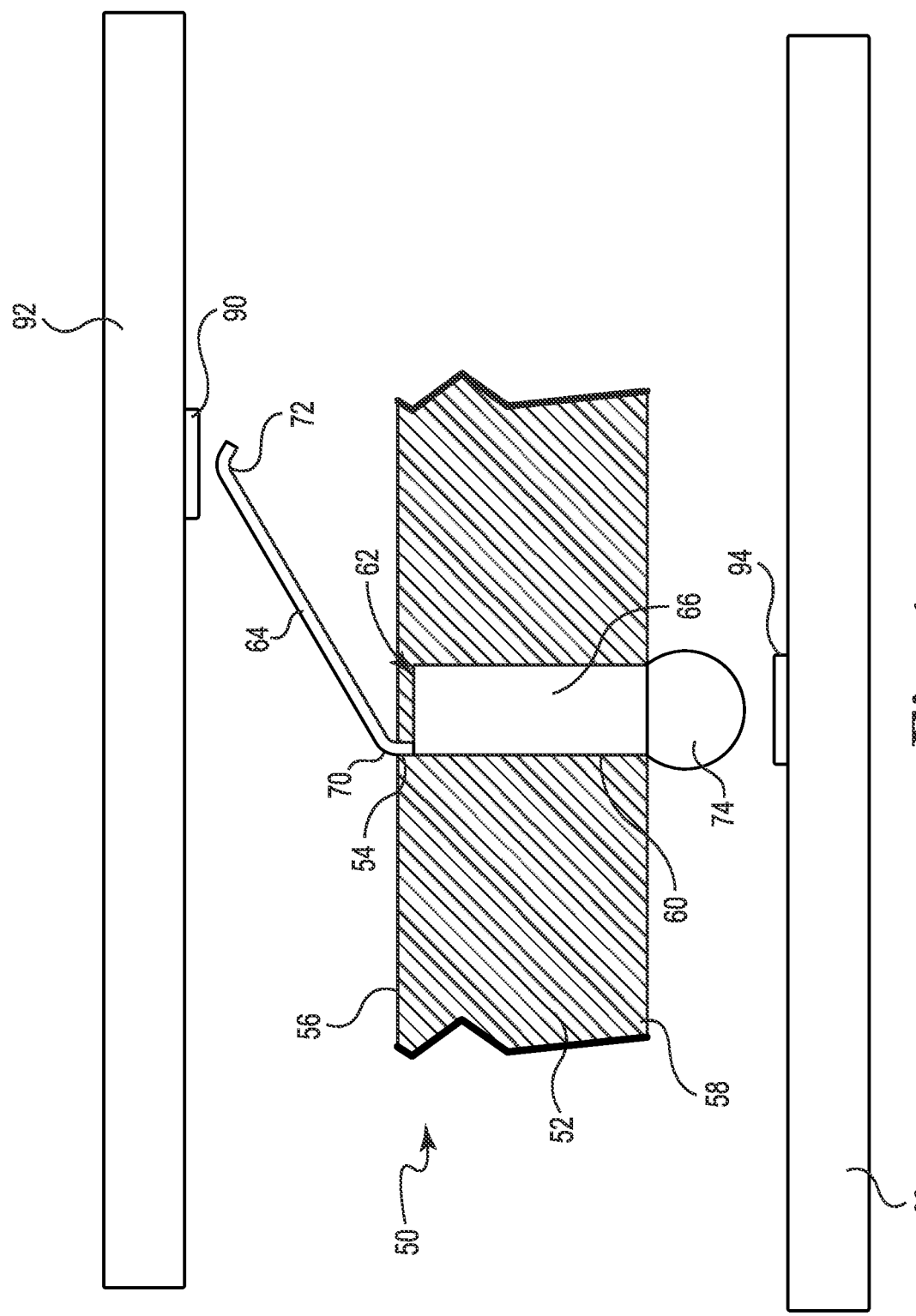
FIG. 1 is a cross-sectional view of a semiconductor socket in accordance with an embodiment of the present disclosure.

FIG. 1 is a side cross-sectional view of a portion of a semiconductor socket 50 in accordance with an embodiment of the present disclosure. A substrate 52 includes an array of through holes 54 that extend from a first surface 56 to a second surface 58. Recesses 60 are formed in the second surface 58 that overlaps with the through holes 54. In one embodiment, the substrate 52 is the bottom of a socket housing adapted to receive an IC device, such as for example, IC device 92. Although the substrate 52 is illustrated as a generally planar structure, a semiconductor socket according to the present disclosure may include one or more recesses for receiving IC devices and a cover assembly for retaining the IC devices to the substrate 52, such as disclosed in U.S. Pat. No. 7,101,210 (Lin et al.); U.S. Pat. No. 6,971,902 (Taylor et al.); U.S. Pat. No. 6,758,691 (McHugh et al.); U.S. Pat. No. 6,461,183 (Ohkita et al.); and U.S. Pat. No. 5,161,983 (Ohno et al.), which are hereby incorporated by reference.

The substrate 52 may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

The substrate 52 may also be constructed from metal, such as aluminum, copper, or alloys thereof, with a non-conductive surface, such as an anodized surface. In another embodiment, a metal substrate can be overmolded with a dielectric polymeric material. For example, a copper substrate may be placed in a mold and plastic may be injected around it.

In embodiments where the substrate 52 is a coated metal, the substrate 52 can be grounded to the electrical system, thus providing a controlled impedance environment. Some of contact members 62 can be grounded by permitting them to contact an uncoated surface of the metal housing.

The substrate 52 may also include stiffening layers, such as metal, ceramic, or alternate filled resins, to be added to maintain flatness where a molded or machined part might warp. The substrate 52 may also be multi-layered (having a plurality of discrete layers).

A plurality of discrete contact members 62 are inserted into recesses 60 so distal portions 64 extend out through the holes 54. In the illustrated embodiment, the distal portions 64 are simple cantilever beams located above the first surface 56. The distal portions 64 preferably have a generally uniform cross section. The cross-sectional shape can be rectangular, square, circular, triangular, or a variety of other shapes.

Proximal portions 66 are preferably configured to reside in the recesses 60. In one embodiment, proximal portions 66 form an interference fit with recesses 60. The contact members 62 can be deposited into the recesses 60 using a variety of techniques, such as for example stitching or vibratory techniques.

The contact members 62 are preferably constructed of copper or similar metallic materials such as phosphor bronze or beryllium-copper. The contact members are preferably plated with a corrosion resistant metallic material such as nickel, gold, silver, palladium, or multiple layers thereof. In some embodiments the contact members 62 are encapsulated except the distal and proximal ends. Examples of suitable encapsulating materials include Sylgard® available from Dow Corning Silicone of Midland, Mich. and Master Sil 713 available from Master Bond Silicone of Hackensack, N.J. Suitable contact members are disclosed in U.S. Pat. No. 6,247,938 (Rathburn) and U.S. Pat. No. 6,461,183 (Ohkita et al.), which are hereby incorporated by reference.

In one embodiment, bend 70 is formed after insertion to retain the contact members 62 to the substrate 52. The bend 70 also permits distal portions 64 to flex when coupled to contact pad 90 on first circuit member 92.

Bend 72 in distal portion 64 is optionally provided to enhance coupling with the contact pads 90 on the first circuit member 92. The contact members 62 may have a variety of shapes, such as reversing the bend 72 or basic vertical structures. Proximal portion 66 can be electrically coupled to contact pads 94 on a second circuit member 96 using a variety of techniques, including solder, pressure, and the like. As used herein, the term "circuit member" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

With contact members 62 inserted, the substrate 52 is optionally inverted to expose the proximal ends 66 located within the recess 60. The proximal ends 66, the recesses 60 and the second surface 58 can then be subjected to additional processing as discussed in the various embodiments detailed below. Solder ball 74 is optionally formed on proximal portion 66 of the contact member 62, as discussed in greater detail below.

Figure 2:
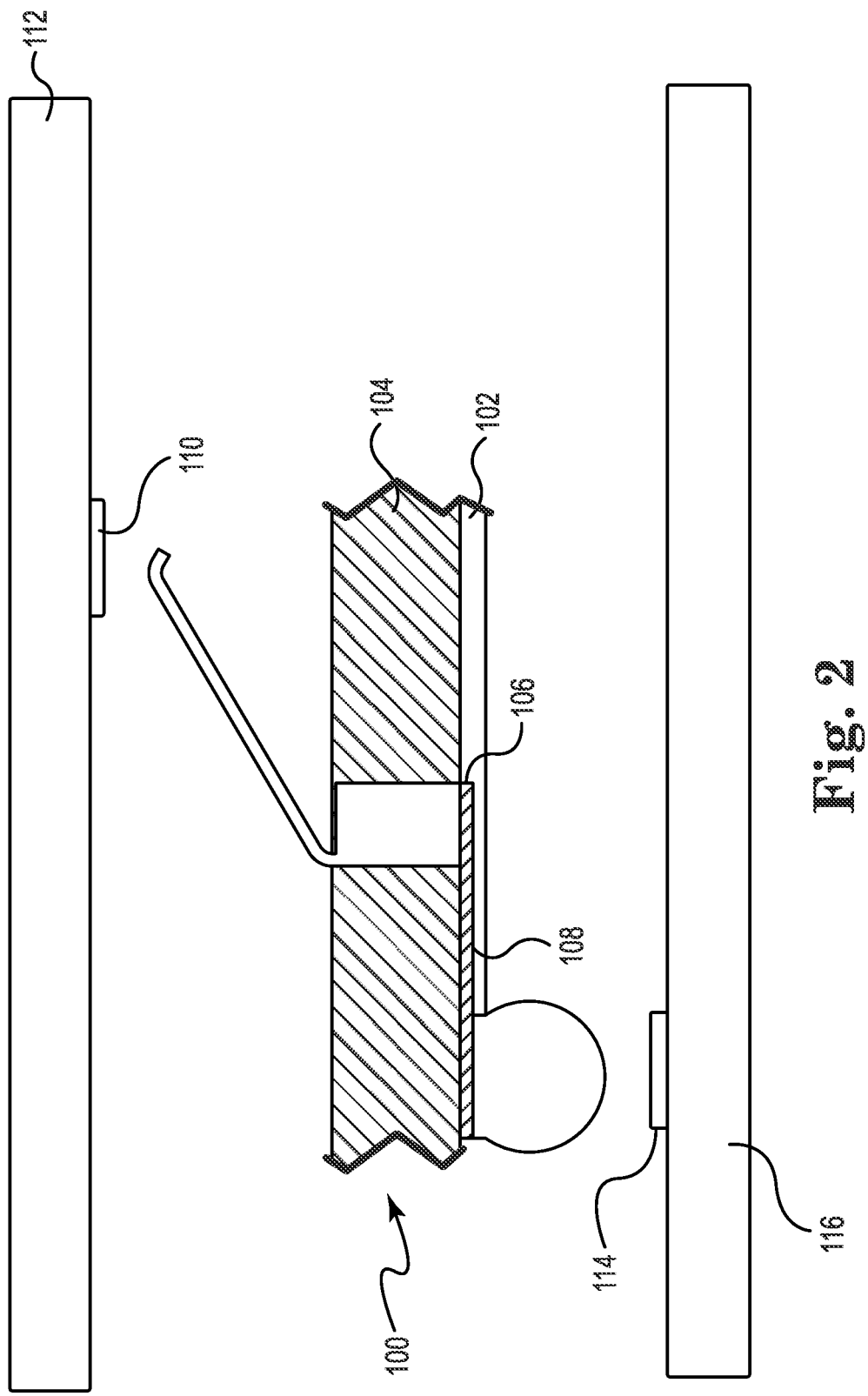
FIG. 2 is a cross-sectional view of a semiconductor socket with conductive traces in accordance with another embodiment of the present disclosure.
Figure 3:
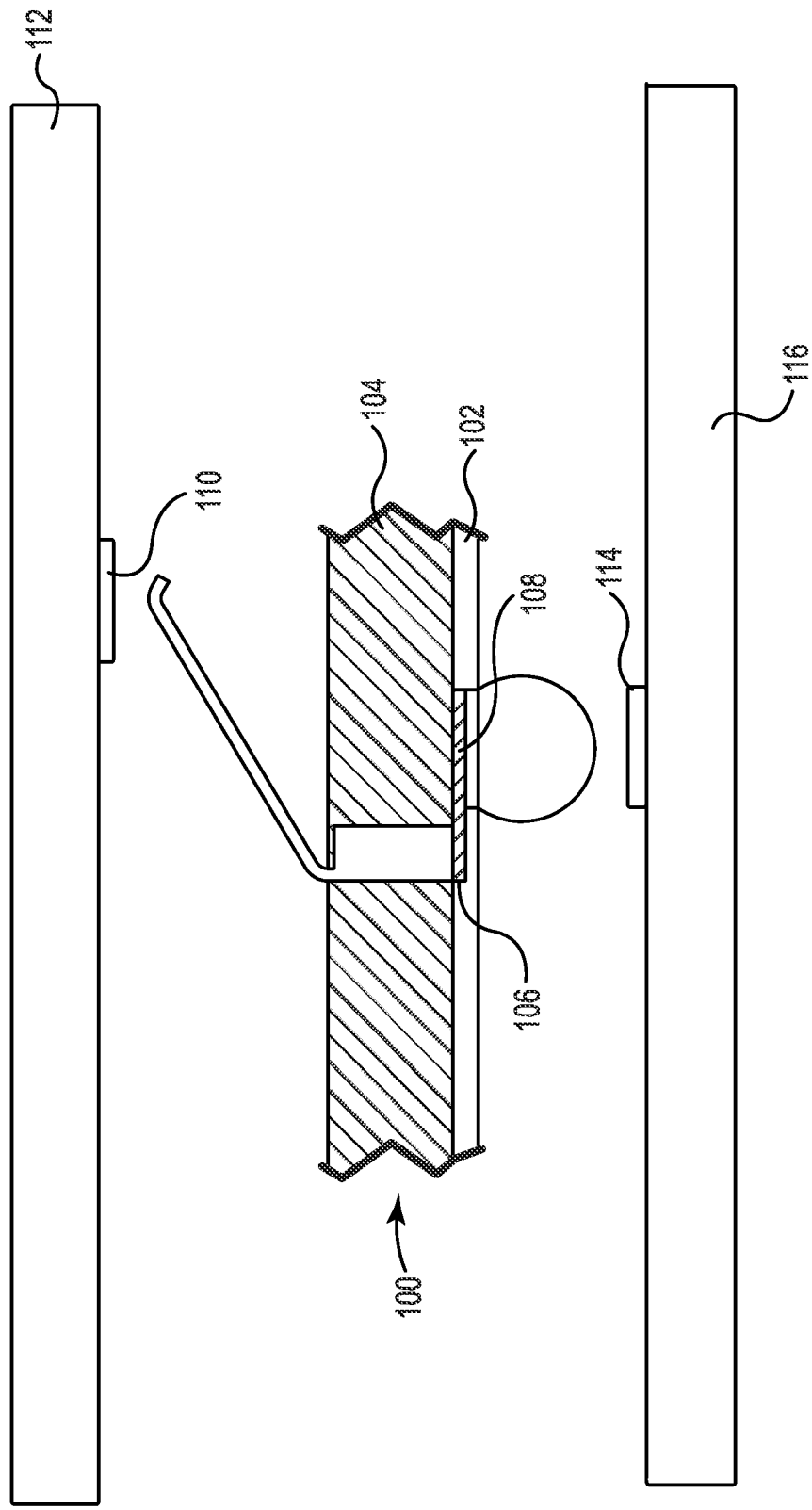
FIG. 3 is a cross-sectional view of an alternate semiconductor socket in accordance with another embodiment of the present disclosure.

FIGS. 2 and 3 illustrate alternate semiconductor sockets 100 in accordance with an embodiment of the present disclosure. Liquid dielectric material 102 is applied on the substrate 104 and imaged to create recesses 106. The recesses 106 in the dielectric material 102 are then metalized to create conductive traces 108. The use of a liquid dielectric material 102 to form recesses 106 in which the conductive traces 108 are formed has application to any of the embodiments disclosed herein.

The dielectric layer 102 is preferably processed to promote electro-less copper plating using one or more of plasma treatment, permanganate, carbon treatment, impregnating copper nano-particles to activate the desired surfaces to promote electroplating. In the illustrated embodiment, the dielectric material 102 is processed to promote plating adhesion. Electro-less copper plating is applied to the recesses 106 to create conductive traces 108. Additional discussion of the use of electro-less plating of the dielectric structure is disclosed in PCT/US2012/53848, filed Sep. 6, 2012, entitled DIRECT METALIZATION OF ELECTRICAL CIRCUIT STRUCTURES, the entire of disclosure of which is hereby incorporated by reference.

The present method permits the material between layers and within each layer to be varied. One aspect of the present process that differs from the traditional dry film build up process is the nature of the dielectric deposition in liquid form. The dielectric layer 102 can be applied by screen printing, stencil printing, jetting, flooding, spraying etc. The liquid material 102 flows and fills any recessed regions within a previous landscape. During the development process, desired regions remain and the regions that are not desired are washed away with fine resolution of the transition regions within the landscape. Multiple depositions steps can be tack cured and imaged such that thicker sections of dielectric 102 can be developed and washed away in one or multiple strip operations. As a result, internal cavities or mass regions can be excavated and subsequently filled at the next dielectric layer with materials that have physical properties differing from the base dielectric 102. In other words, the excavated regions can be filled or treated with materials that have a different dielectric constant, vary in conductive or mechanical or thermal properties to achieve a desired performance function not possible with a contiguous dry film technique.

In basic terms, the present process not only provides the ability to alter the material set and associated properties in a given layer, but the material set can be altered at any given point within a given deposition or layer. Additional disclosure on this process is set forth in PCT/US2013/030856, filed on Mar. 13, 2013, entitled HYBRID PRINTED CIRCUIT ASSEMBLY WITH LOW DENSITY MAIN CORE AND EMBEDDED HIGH DENSITY CIRCUIT REGIONS, which is hereby incorporated by reference.

The present process can also be used in combination with existing dry film techniques. For example, one or more of the layers can be a preformed dielectric film to leave air dielectric gaps between traces. Recesses in the dry film dielectric layer can be formed by printing, embossing, imprinting, laser cutting, chemical etching with a printed mask, or a variety of other techniques.

In the illustrated embodiments, the conductive traces 108 are additional circuitry that creates an offset or redistribution of the pitch between terminals 110 on the semiconductor device 112 and contact pads 114 on the circuit member 116.

In one embodiment, a plating resist is the applied, imaged and developed to expose the recesses 106. Once the surfaces of the recesses 106 are plated, a higher deposition rate electroplate copper can be used to fill the recess 106 with conductive material to build up the conductive traces 108. The plating resist is then stripped.

Alternatively, metalizing can be performed by printing conductive particles followed by a sintering step, by printing conductive inks, or a variety of other techniques. The metalizing material is preferably of copper or similar metallic materials such as phosphor bronze or beryllium-copper. The resulting conductive traces 108 are optionally plated to improve conductive properties. The plating is preferably a corrosion resistant metallic material such as nickel, gold, silver, palladium, or multiple layers thereof.

The dielectric material 102 may include any of a number of materials that provide electrostatic dissipation or to reduce cross-talk between adjacent conductive traces 108. An efficient way to prevent electrostatic discharge ("ESD") is to construct one of the layers 102, 104 from materials that are not too conductive but that will slowly conduct static charges away. These materials preferably have resistivity values in the range of $10^5$ to $10^{11}$ Ohm-meters.

In one embodiment, the conductive traces 108 are formed by depositing a conductive material in a first state in the recesses 106 in the dielectric material, and then processed to create a second more permanent state. For example, the metallic powder is printed and subsequently sintered, or the curable conductive material flows into the recesses 106 and is subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source.

The recesses 106 permit control of the location, cross section, material content, and aspect ratio of the conductive traces 108. Maintaining the conductive traces 108 with a cross-section of 1:1 or greater provides greater signal integrity than traditional subtractive trace forming technologies. For example, traditional methods take a sheet of a given thickness and etch the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 106 to control the aspect ratio of the conductive traces 108 results in a more rectangular or square cross-section of the conductive traces 108, with the corresponding improvement in signal integrity.

In another embodiment, pre-patterned or pre-etched thin conductive foil circuit traces are transferred to the recesses 106. For example, a pressure sensitive adhesive can be used to retain the copper foil circuit traces in the recesses 106. The trapezoidal cross-sections of the pre-formed conductive foil traces are then post-plated. The plating material fills the open spaces in the recesses 106 not occupied by the foil circuit geometry, resulting in a substantially rectangular or square cross-sectional shape corresponding to the shape of the recesses 106.

In another embodiment, a thin conductive foil is pressed into the recesses 106, and the edges of the recesses 106 act to cut or shear the conductive foil. The process locates a portion of the conductive foil in the recesses 106, but leaves the negative pattern of the conductive foil not wanted outside and above the channels for easy removal. Again, the foil in the channels are preferably post plated to add material to increase the thickness of the conductive traces 108 and to fill any voids left between the conductive foil and the recesses 106.

Figure 4:
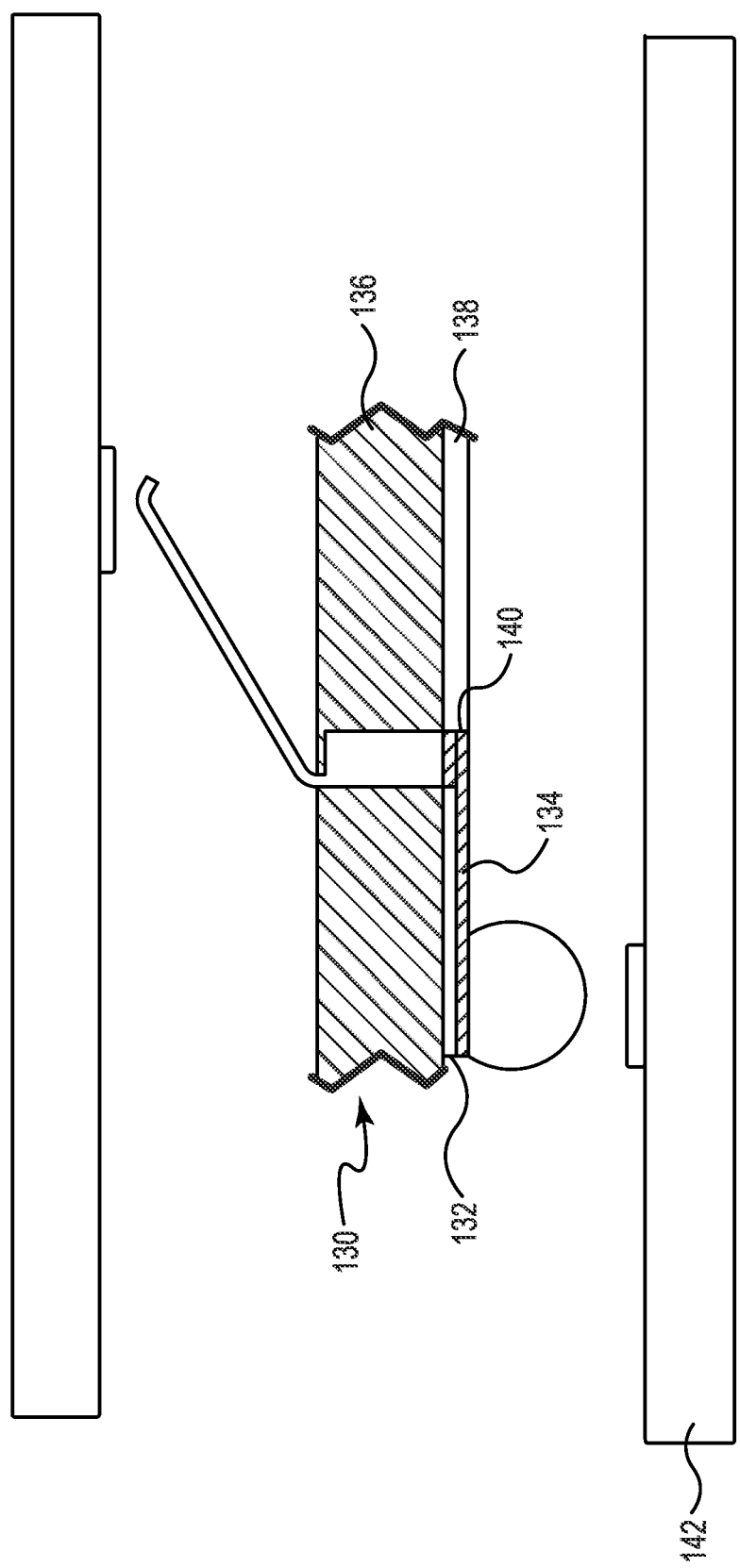
FIG. 4 is a cross-sectional view of a semiconductor socket with a compliant layer located between a substrate and a conductive trace in accordance with another embodiment of the present disclosure.

FIG. 4 illustrates semiconductor socket 130 with a compliant layer 132 supporting the conductive traces 134 in accordance with an embodiment of the present disclosure. Compliant layer 132 is preferably deposited on substrate 136, followed by dielectric layer 138 creating recesses 140 for forming the conductive traces 134. The conductive traces 134 are formed as discussed herein. The compliant layer 132 serves to decouple thermal and mechanical stress between the substrate 136 and the circuit member 142.

Figure 5:
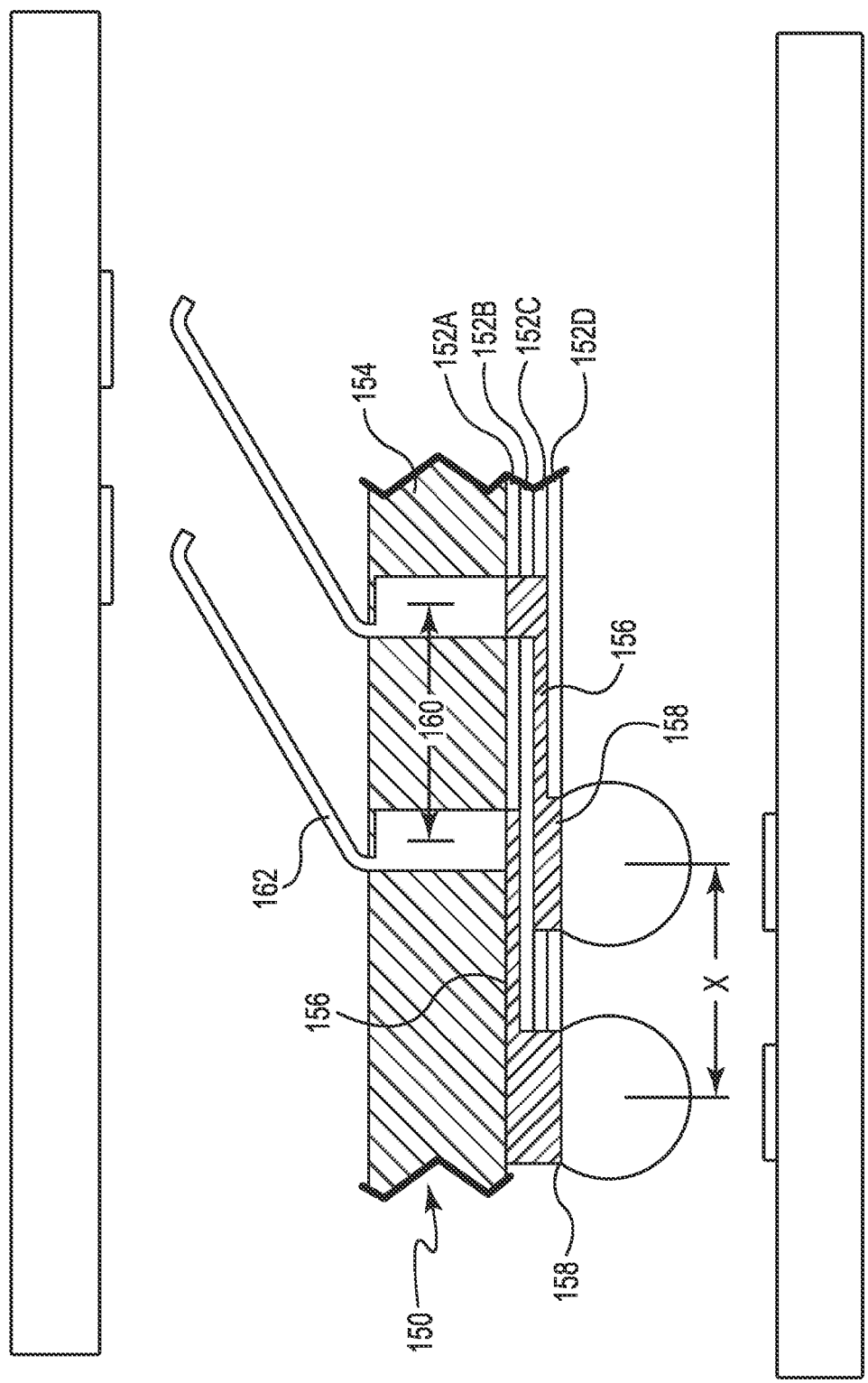
FIG. 5 is a cross-sectional view of a semiconductor socket with multiple layers of conductive traces in accordance with another embodiment of the present disclosure.

FIG. 5 illustrates semiconductor socket 150 with multi-layered conductive traces in accordance with an embodiment of the present disclosure. Liquid dielectric layers 152A, 152B, 152C, 152D (collectively "152") are successively deposited and selectively imaged to create recesses into which circuit traces 156 and/or contact pads 158 are formed to redistribute the pitch 160 of contact members 162. In one embodiment, layer 152B optionally includes a compliant material.

Figure 6:
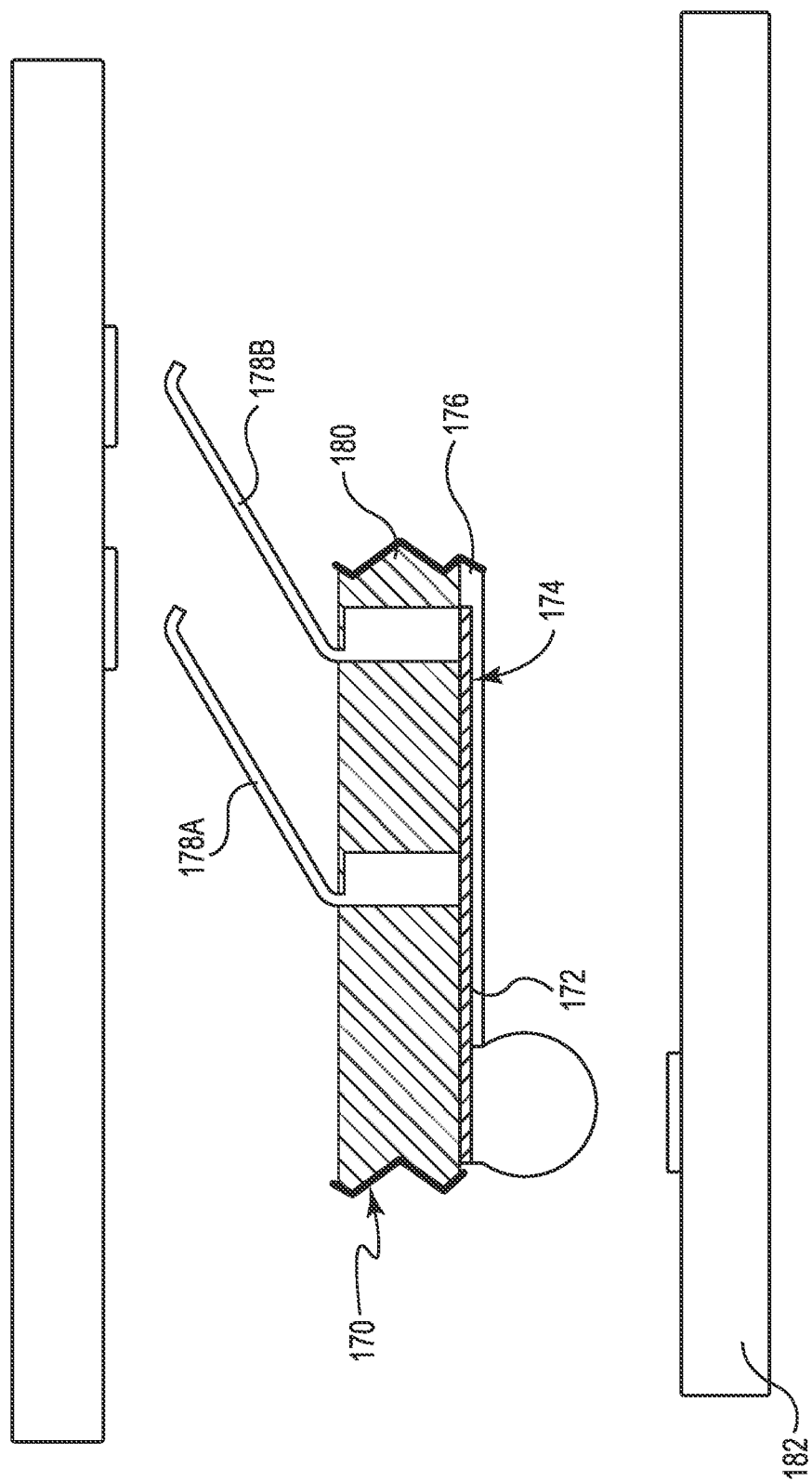
FIG. 6 is a cross-sectional view of a semiconductor socket with a ground plane in accordance with another embodiment of the present disclosure.

FIG. 6 illustrates semiconductor socket 170 with conductive traces 172 serving as a ground plane 174 in accordance to an embodiment of the present disclosure. Liquid dielectric layer 176 is imaged so conductive traces 172 connect multiple contact members 178A, 178B. Forming the ground plane 174 on substrate 180 enhances performance and reduces ground connections to circuit member 182.

Figure 7:
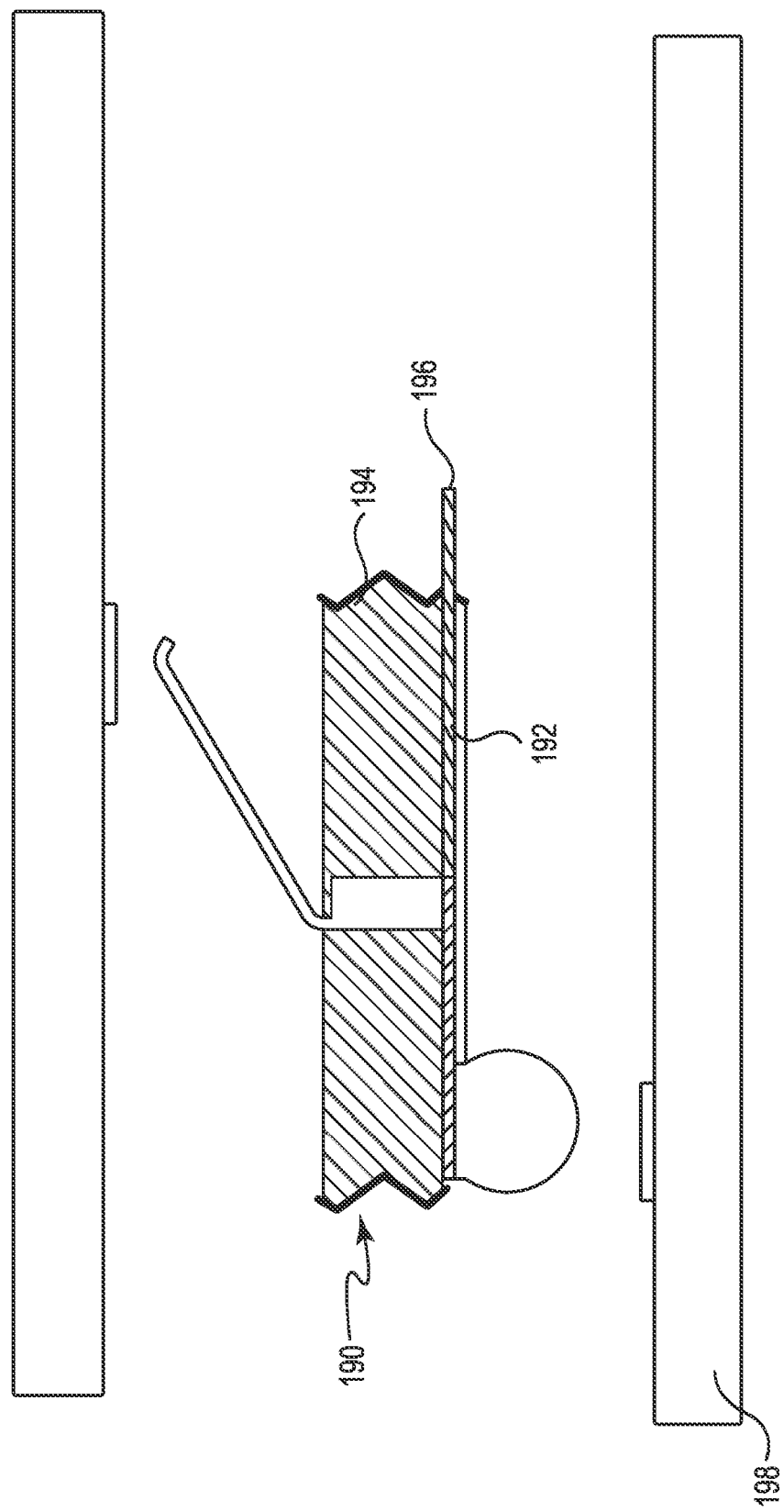
FIG. 7 is a cross-sectional view of a semiconductor socket with conductive traces electrically coupling a plurality of contact members to a location external to the substrate in accordance with another embodiment of the present disclosure.

FIG. 7 is a cross-sectional view of a semiconductor socket 190 according to another embodiment where the conductive traces 192 formed on substrate 194 are used to connect to another circuit, such as for example, a power management circuit. The conductive traces 192 extend beyond a perimeter edge of the substrate 194 to an external connection 196 that does not flow through circuit member 198. In one embodiment, the conductive traces 192 are supported by a dielectric material, such as for example a polymeric film used to manufacture flexible circuits. The conductive traces 192 can deliver, condition, and manage power from the external connection 196 separate from power provided by the circuit member 198. The conductive traces are preferably formed using a combination of electro-less plating and electro-plating discussed herein.

Figure 8:
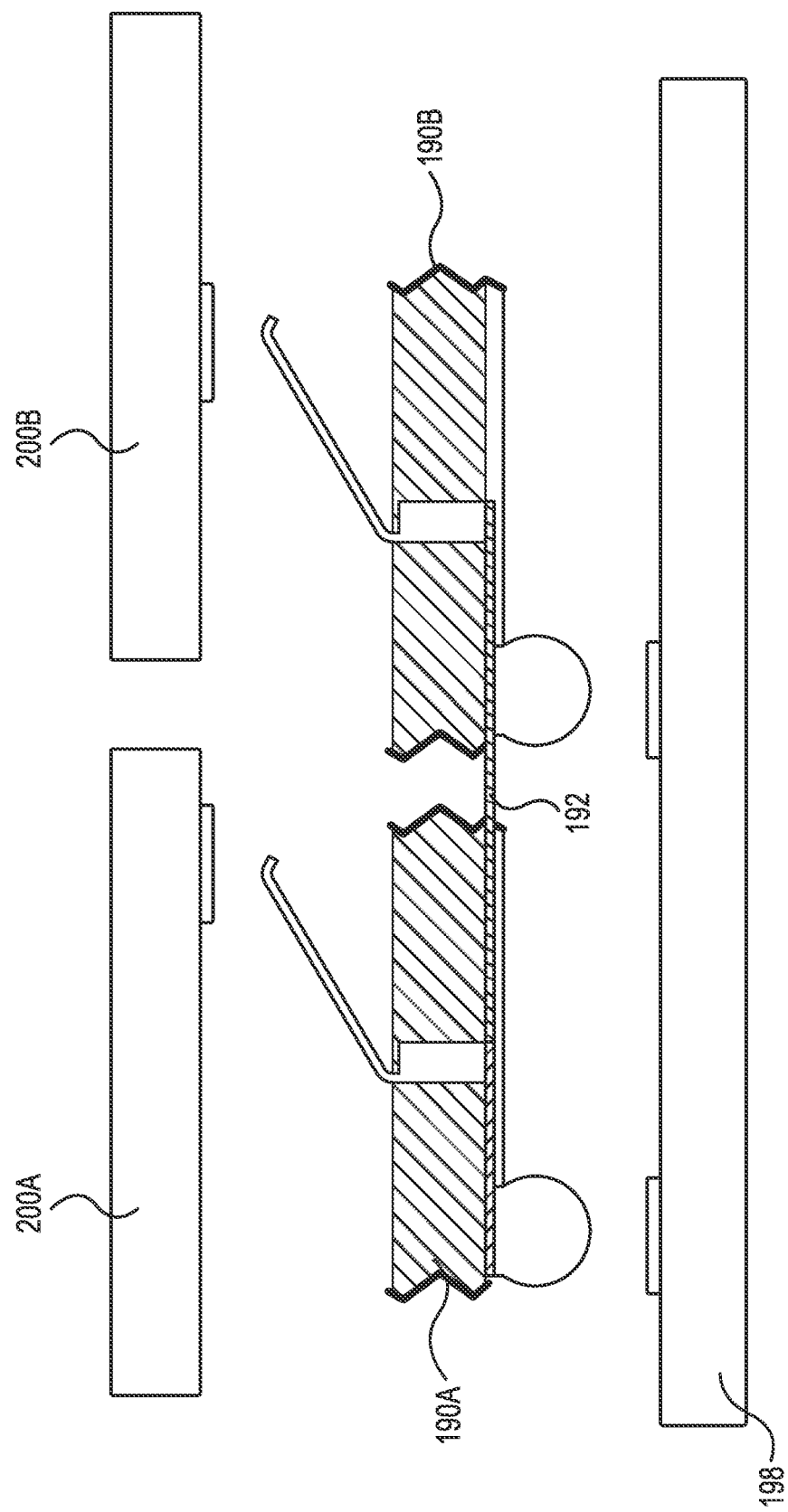
FIG. 8 is a cross-sectional view of two semiconductor sockets electrically coupled by conductive traces in accordance with another embodiment of the present disclosure.

FIG. 8 is a variation of FIG. 7 that uses the conductive traces 192 to electrically couple two or more semiconductor sockets 190A and 190B. Each circuit member 190A, 190B includes a semiconductor device 200A, 200B. The conductive traces 192 permit socket-to-socket connection of the semiconductor devices 200A, 200B external to the circuit member 198. The conductive traces 192 are preferably supported by a flexible polymeric film.

Figure 9:
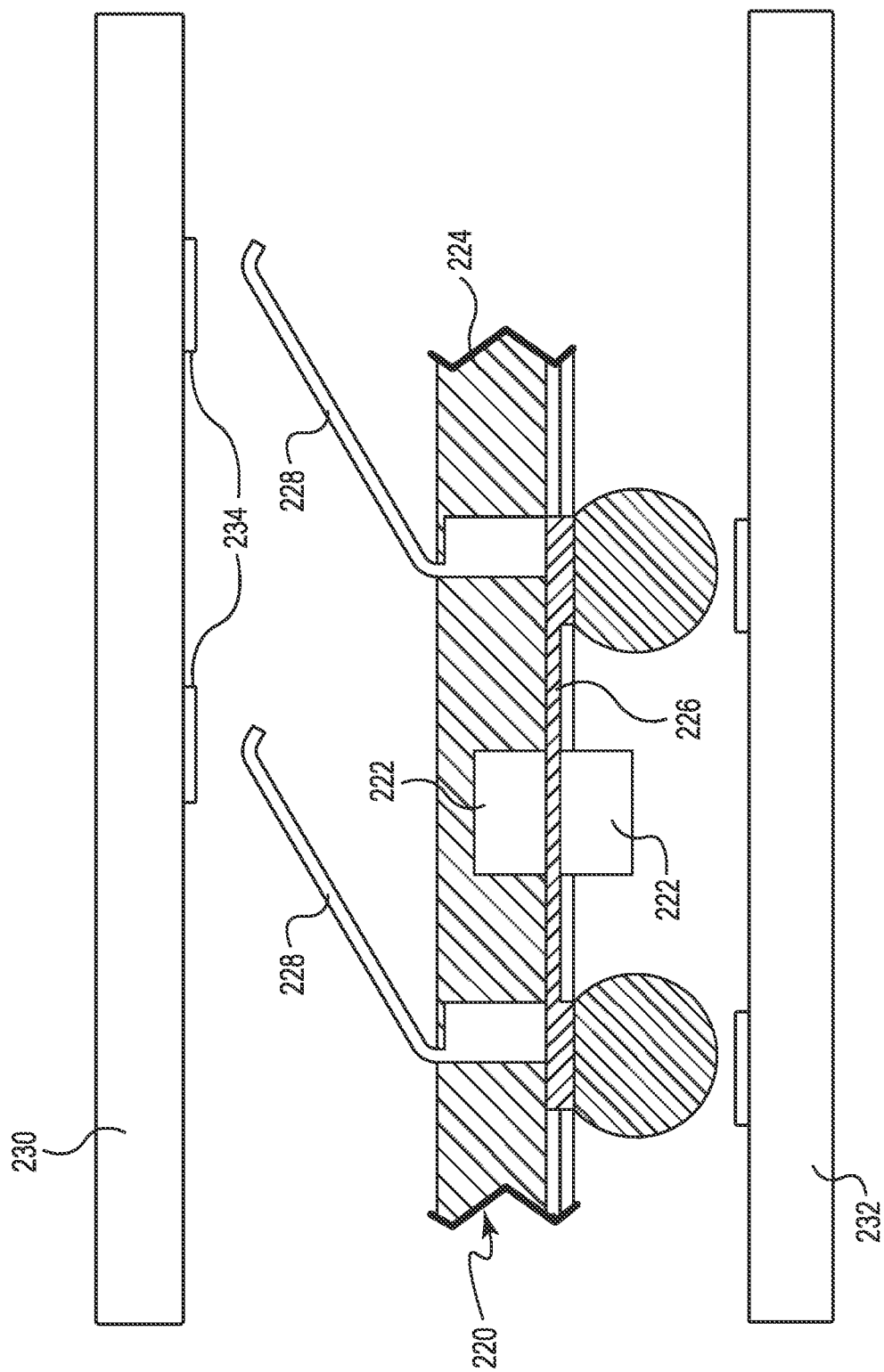
FIG. 9 is a cross-sectional view of a semiconductor socket including other electrical devices in accordance with other embodiments of the present disclosure.

FIG. 9 illustrates semiconductor socket 220 with electrical devices 222, such as for example, internal decoupling capacitors, located on substrate 224 in accordance with an embodiment of the present disclosure. Conductive traces 226 electrically couple the electrical devices 222 to one or more of the contact members 228. The electrical devices 222 can be added as discrete components or printed materials, reducing the need for discrete components on the first and second circuit members 230, 232.

The electrical devices 222 can be a power plane, ground plane, capacitor, resistor, filters, signal or power altering and enhancing device, memory device, embedded IC, RF antennae, and the like. The electrical devices 222 can be located on either surface of the substrate 224, or embedded therein. The electrical devices 222 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

Locating such electrical devices 222 on the semiconductor socket 220 improves performance and enables a reduction in the cost of the integrated circuit 230, the socket 220, and the printed circuit board 232. Integrated circuit manufactures are limited by the pitch that the printed circuit board 232 can accommodate and still keep the printed circuit board to four layers. The integrated circuit makers can manufacture the package 230 with a smaller pitch, but with the pin counts is so high that the printed circuit board 232 likely requires additional layers in order to route all of the signals. The present semiconductor socket 220 permits integrated circuit manufactures to reduce the pitch of the contacts 234 on the package 230, and perform any required signal routing in the semiconductor socket 220, rather than in the printed circuit board 232 or by adding daughter boards to the system.

Integrated circuit manufactures also are limited by current socket designs when designing the configuration of contacts 234 on the package 230. Performing the routing in the present semiconductor socket 220 permits quick and inexpensive changes. Similarly, locating the electrical devices 222 in the semiconductor socket 220 permits integrated circuit manufactures to reduce or eliminate the capacitors currently located on the package 230 and printed circuit board 232. This shift can greatly reduce cost and simplify the package 230 and printed circuit board 232, while improving performance.

One of the reasons the contact members on prior art sockets are so long (typically about 3 millimeters) is to provide clearance for the capacitors on the package 230 and the printed circuit board 232 when the integrated circuit is put into the socket. Locating the electrical devices 222 in the present semiconductor socket 220 permits the contact members 228 to be shorter, which will improve electrical performance.

The availability of printable silicon inks provides the ability to print electrical devices 222 and conductive traces 226, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 222 and conductive traces 226 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate-silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layers are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 10:
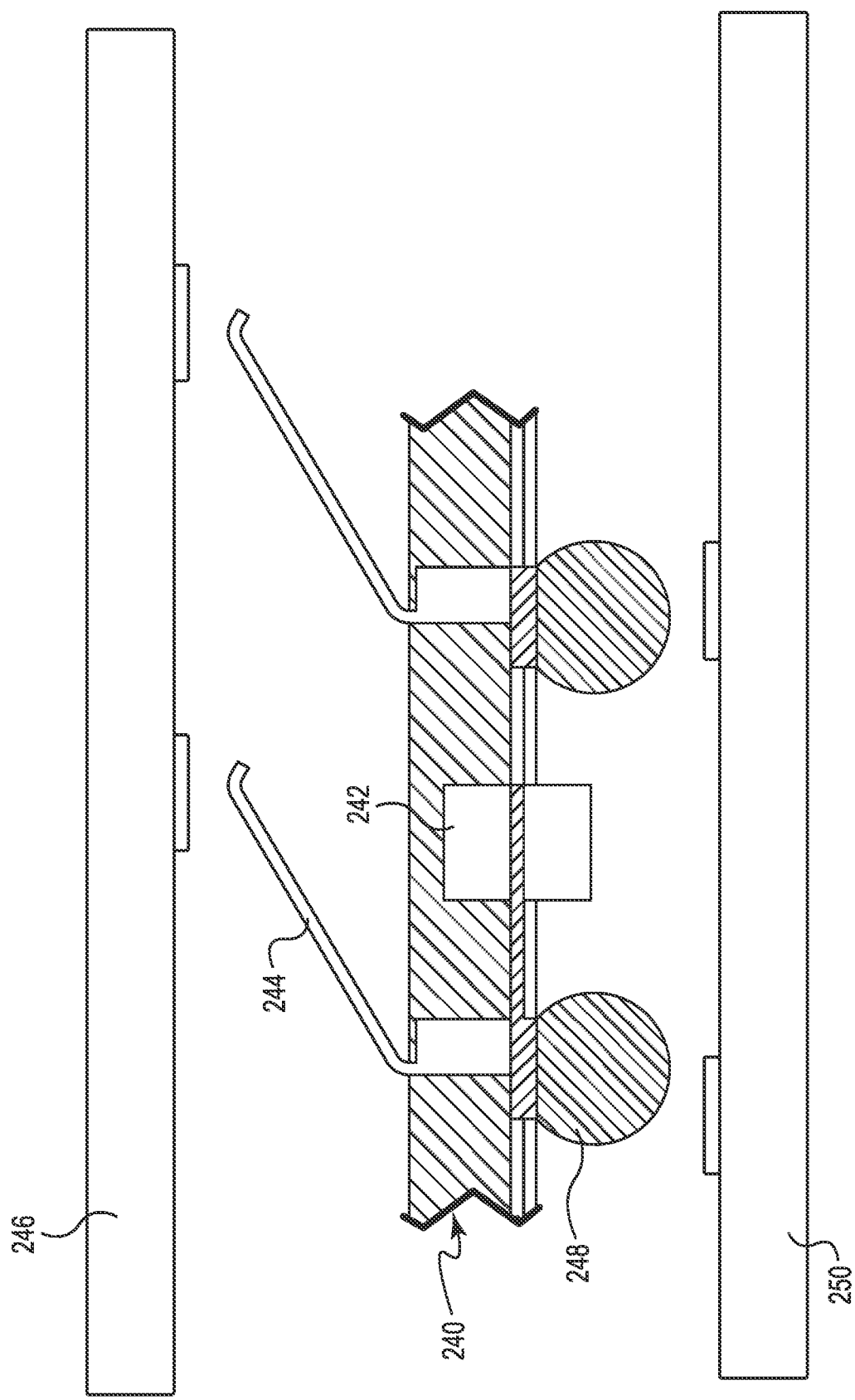
FIG. 10 is a cross-sectional view of an alternate semiconductor socket including other electrical devices in accordance with other embodiments of the present disclosure.

FIG. 10 illustrates an alternate semiconductor socket 240 with internal decoupling capacitance 242 in accordance with an embodiment of the present disclosure. The decoupling capacitance 242 can be a discrete embedded or printed electrical device. Contact member 244 provides the electrical connection to the capacitor located on the semiconductor device 246 and solder ball 248 provides the electrical connection to the capacitor located on printed circuit board 250.

Figure 11:
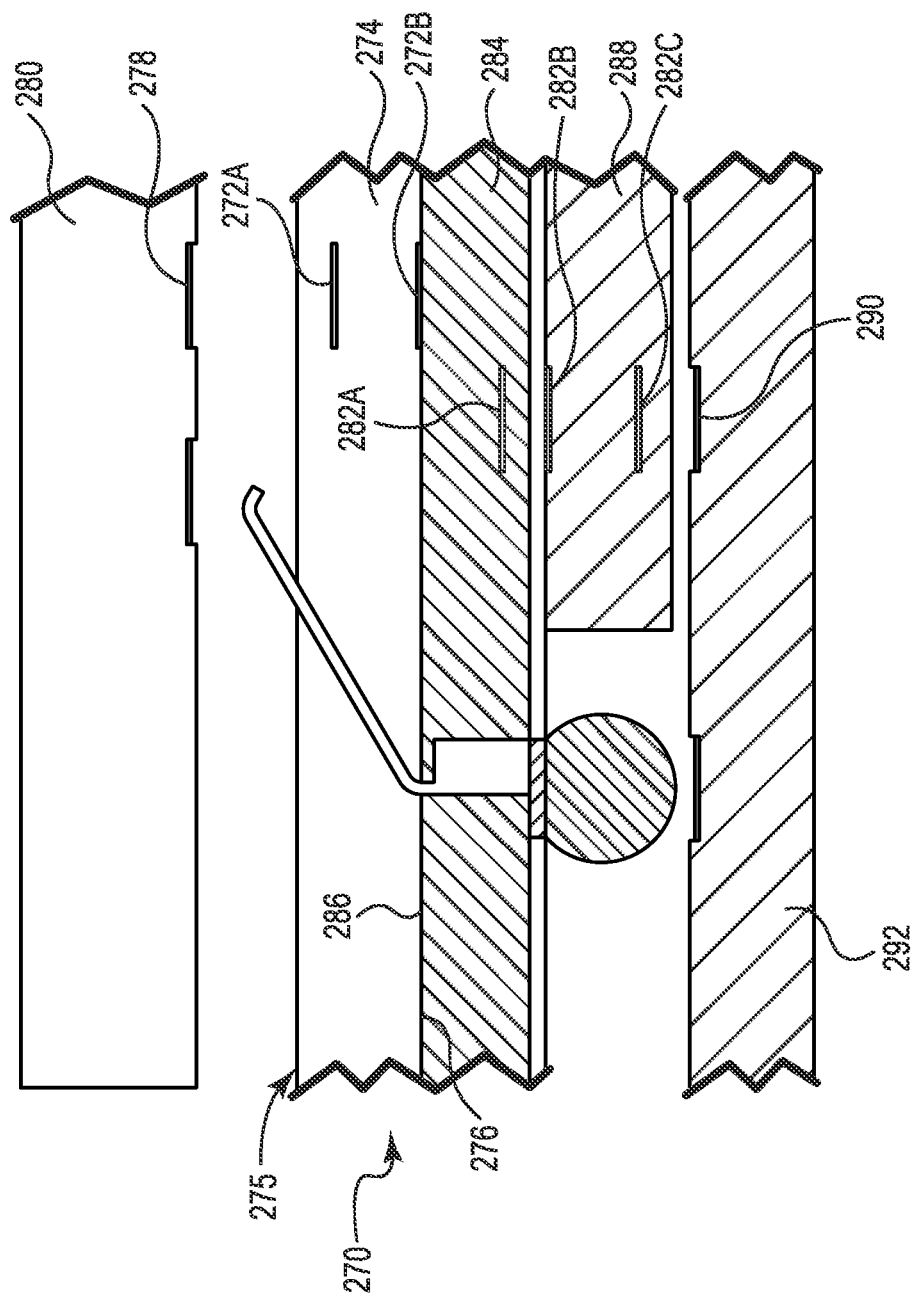
FIG. 11 is a cross-sectional view of a semiconductor socket with capacitive coupling features in accordance with another embodiment of the present disclosure.

FIG. 11 is a cross-sectional view of semiconductor socket 270 with various capacitive coupling features in accordance with another embodiment of the present disclosure. A capacitive coupling feature 272A is embedded in layer 274 of the substrate 275. A capacitive coupling feature 272B is located on second surface 276 of the layer 274. The capacitive coupling features 272A, 272B are positioned to electrically couple with contact pad 278 on first circuit member 280.

Capacitive coupling feature 282A is embedded in layer 284 of the substrate 275. Capacitive coupling feature 282B is located on first surface 286 of the layer 284. The capacitive coupling feature 282C is embedded in layer 288. All three capacitive coupling features 282A, 282B, 282C are positioned to electrically couple with contact pad 290 on the second circuit member 292. The various capacitive coupling features in the embodiment of FIG. 11 are optionally formed using inkjet printing technology, aerosol printing technology, or other printing technology.

Figure 12:
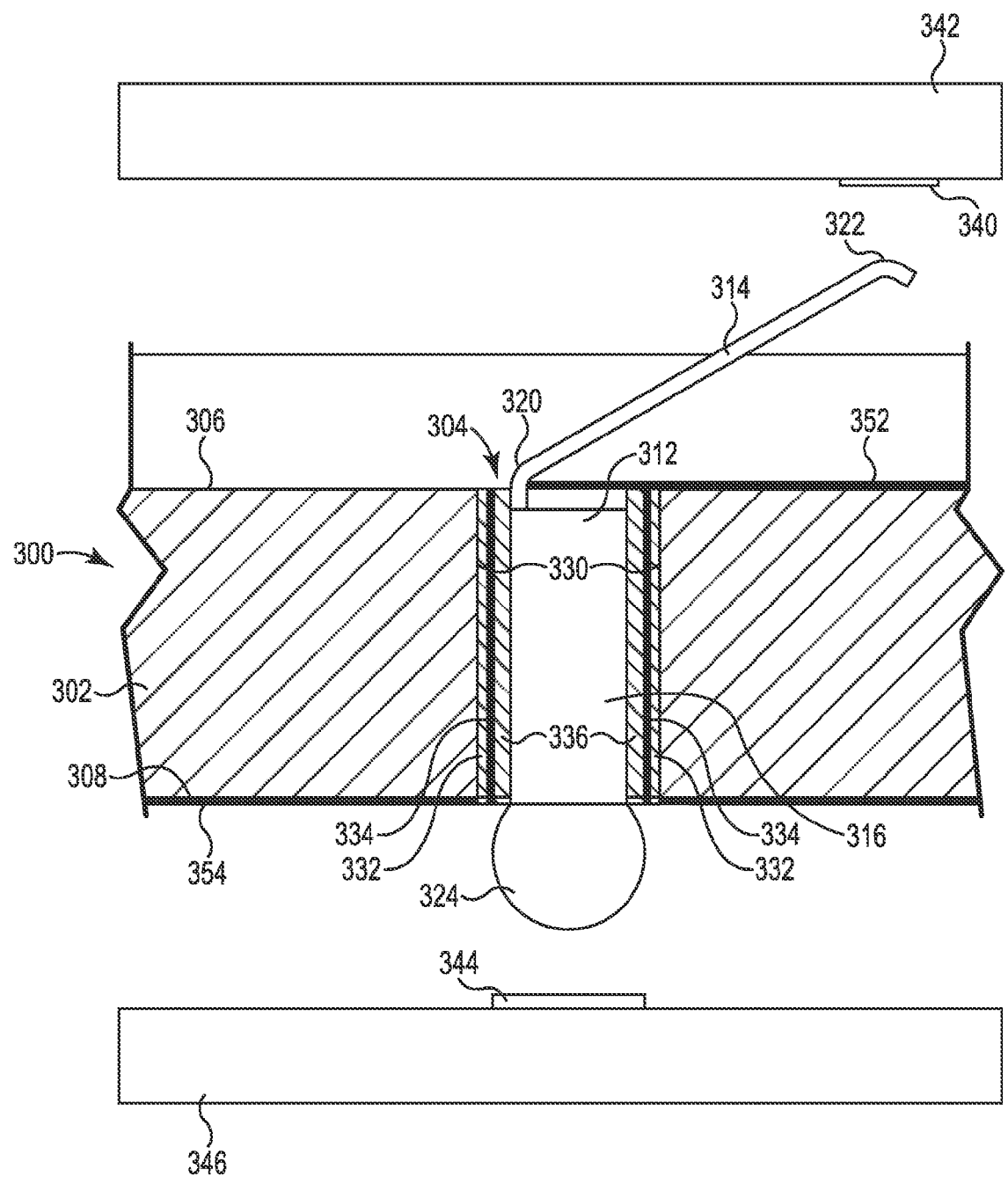
FIG. 12 is a cross-sectional view of a semiconductor socket that is selectively metalized in accordance with another embodiment of the present disclosure.

FIG. 12 is a side cross-sectional view of a portion of a semiconductor socket 300 that is selectively metalized in accordance with another embodiment of the present disclosure. The socket includes a substrate 302. The substrate 302 includes an array of through holes 304 that extend from a first surface 306 to a second surface 308. In one embodiment, the substrate 302 is the bottom of a socket housing adapted to receive an IC device, such as for example, IC device 342. Although the substrate 302 is illustrated as a generally planar structure, a semiconductor socket according to the present disclosure may include one or more recesses for receiving IC devices and a cover assembly for retaining the IC devices to the substrate 302, such as disclosed in U.S. Pat. No. 7,101,210 (Lin et al.); U.S. Pat. No. 6,971,902 (Taylor et al.); U.S. Pat. No. 6,758,691 (McHugh et al.); U.S. Pat. No. 6,461,183 (Ohkita et al.); and U.S. Pat. No. 5,161,983 (Ohno et al.), which are hereby incorporated herein by reference in their entirety.

The substrate 302 may be constructed of any of a number of dielectric materials that are currently used to make sockets, semiconductor packaging, and printed circuit boards, as described above with reference to the substrate 52 of FIG. 1. As shown in FIG. 12, the plurality of through holes 304 may extend through the substrate 302 transverse to the first surface 306, the second surface 308, and/or a plane of the substrate 302. For example, the through holes 304 may be perpendicular or approximately perpendicular to the first surface 306, the second surface 308 of the substrate 302, and/or a plane of the substrate 302.

The plurality of through holes 304 can be selectively metalized, for example by processing the dielectric material 332 to receive electro-less plating 334, as discussed herein. For example, a liquid dielectric material 332 may be deposited on substrate inner walls 330 within the through holes 304. Stated differently, the inner surfaces 330 of the substrate within the through holes 304 may be treated with a dielectric material 332 or other suitable surface treatment process to enable direct deposit of metal or other conductive material using electro-less plating. Metal such as copper (or another conductive material) may be deposited on the dielectric material 332 to create a conductive sleeve 334. The sleeves 334 can optionally be plated using an electroplating process to increase thickness.

Because through holes 304 are transverse to the first surface 306, the second surface 308, and/or the plane of the substrate 302, the inner walls 330 of the through holes 304 are also transverse to the first surface 306, the second surface 308, and/or the plane of the substrate 302 and, accordingly, the conductive sleeve 334 may extend transverse to the first surface 306, the second surface 308, and/or the plane of the substrate 302. For example, the conductive sleeve 334 may be disposed perpendicular or approximately perpendicular to one or more of the first surface 306, the second surface 308, and/or the plane of the substrate 302.

As explained previously, metalizing can be performed by processing the dielectric material to receive electro-less plating followed by an electro-plating step. The metalizing material is preferably of copper or similar metallic materials such as phosphor bronze or beryllium-copper. The plating is preferably a corrosion resistant metallic material such as nickel, gold, silver, palladium, or multiple layers thereof. The metallization can be selectively deposited within a through hole 304 by only treating the areas of the dielectric material 332 where metal is desired, such as utilizing masking. Alternatively or in addition, excess metal can be etched or removed selectively to provide a desired conductive sleeve 334 structure.

The conductive sleeve 334 may provide electrical performance and signal integrity enhancements as compared to a similar semiconductor socket structure without the metallization. For example, the conductive sleeve 334 can be electrically coupled to at least a portion of the circuitry of the socket, such as tied to ground or tied to a power plane. The conductive sleeve 334 may, thereby, allow for reductions in complexity of a package and/or IC device while improving the overall performance of the interconnect socket and system. As another example, the conductive sleeve 334 may provide a capacitive coupling effect to tune impedance and/or shield a contact member 312 disposed within the through hole 304. The conductive sleeve 334 may thereby, provide performance enhancements, such as reducing the effects of cross talk between nearby pins. In another embodiment, the conductive sleeves 334 can be configured as an antennae or an RF connector.

Additional dielectric material 336 is typically deposited or otherwise processed to insulate the proximal portion 316 of a contact member 312 disposed within the through hole 304 from the conductive sleeve 334.

A plurality of discrete contact members 312 are then inserted into and/or extend out the through holes 304. In the illustrated embodiment, a distal portion 314 of a contact member is a simple cantilever beam located above the first surface 306. The distal portions 314 may preferably have a generally uniform cross section. The cross-sectional shape can be rectangular, square, circular, triangular, or a variety of other shapes.

A proximal portion 316 of a contact member may be configured to be disposed within the substrate 302 in a through hole 304. In one embodiment, the proximal portions 316 form an interference fit within the through holes 304. The contact members 312 can be deposited into the through holes 304 using a variety of techniques, such as for example stitching or vibratory techniques.

As described above, the contact members 312 are preferably constructed of copper or similar metallic materials such as phosphor bronze or beryllium-copper. The contact members are preferably plated with a corrosion resistant metallic material such as nickel, gold, silver, palladium, or multiple layers thereof. In some embodiments the contact members 312 are encapsulated except the distal and proximal ends. Examples of suitable encapsulating materials include Sylgard® available from Dow Corning Silicone of Midland, Mich. and Master Sil 713 available from Master Bond Silicone of Hackensack, N.J.

In one embodiment, a bend 320 is formed after insertion to retain the contact members 312 to or within the substrate 302. The bend 320 also permits distal portions 314 to flex when coupled to contact pad 340 on first circuit member 342.

A second bend 322 in distal portion 314 is optionally provided to enhance coupling with the contact pads 340 on the first circuit member 342. The contact members 312 may have a variety of shapes, such as reversing the bend 322 or basic vertical structures. Proximal portion 316 can be electrically coupled to contact pads 344 on a second circuit member 346 using a variety of techniques, including solder, pressure, and the like. A solder ball 324 is optionally formed on proximal portion 316 of the contact member 312, as shown in the illustrated embodiment, at a proximal end of the proximal portion 316, at or approximately near the second surface 308.

In the embodiment of FIG. 12, the substrate 302 includes an additional metal layer 352 at or on the first surface 306 and/or an additional metal layer 354 at or on the second surface 308. At least one of the additional layers, for example the first metal layer 352 on the first surface 306 of the substrate 302, may be a conductive trace and/or conductive plating that may be formed by a metalizing process as described above.

In the illustrated embodiment of FIG. 12, the contact member 312 and the conductive sleeve 334 are tied to the first metal layer 352. As can be appreciated, in other embodiments the first metal layer 352, the conductive sleeve 334, and the contact member 312 may be configured and arranged such that the first metal layer 352 is tied to either the contact member 312 or the conductive sleeve 334, and not both. The second metal layer 354 may be a grounding plane. In other embodiments, the second metal layer 354 may be a power plane. In the illustrated embodiment, the second metal layer 354 is not tied to either the contact member 312 or the conductive sleeve 334. However, in other embodiments, the second metal layer 354 may be tied to one of the contact member 312 or the conductive sleeve 334 or both.

Figure 13:
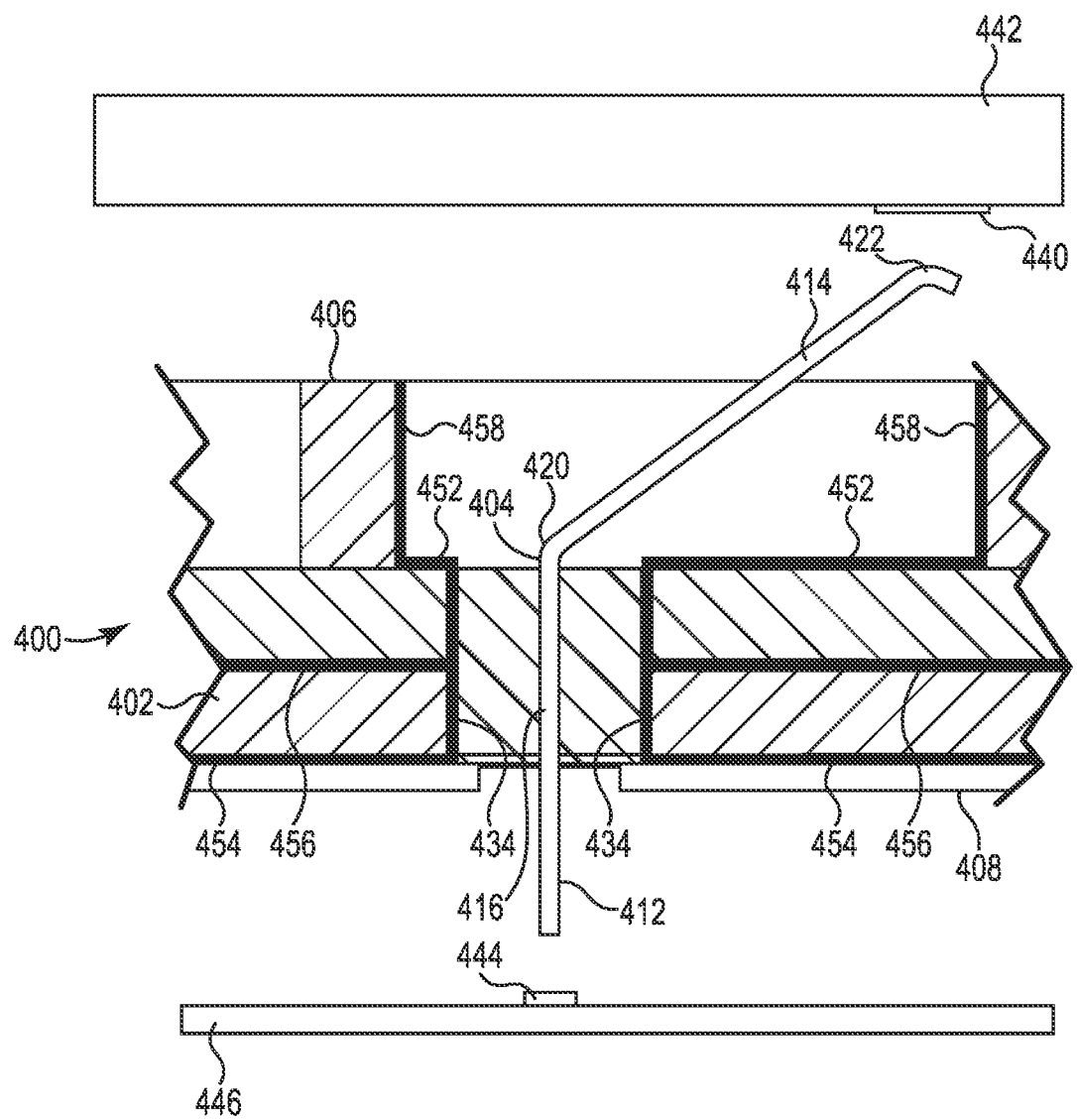
FIG. 13 is a cross-sectional view of a semiconductor socket that is selectively metalized in accordance with another embodiment of the present disclosure.

FIG. 13 is a side cross-sectional view of a portion of a semiconductor socket 400 that is selectively metalized in accordance with another embodiment of the present disclosure. FIG. 13 illustrates multiple deposition targets that can be selectively placed to provide internal grounding and pin to pin shielding.

The substrate of the socket 400 can be a hybrid of a basic substrate or molded coupon with over molded and masked features to create the overall assembly structure. The substrate 402 may be constructed of any of a number of dielectric materials that are currently used to make sockets, semiconductor packaging, and printed circuit boards, as described above with reference to the substrate 52 of FIG. 1.

The substrate 402 includes an array of through holes 404 that extend from a first surface 406 of the substrate 402 to a second surface 408 of the substrate 402. The plurality of through holes 404 may extend through the substrate 402 transverse to the first surface 406, the second surface 408, and/or the plane of the substrate 402. For example, the through holes 404 may be perpendicular or approximately perpendicular to one or more of first surface 406, the second surface 408, and/or the plane of the substrate 402.

A plurality of discrete contact members 412 are inserted into and/or extend out the through holes 404. In the illustrated embodiment, a distal portion 414 of a contact member is a simple cantilever beam extending above the first surface 406. The distal portions 414 may preferably have a generally uniform cross section. The cross-sectional shape can be rectangular, square, circular, triangular, or a variety of other shapes. A proximal portion 416 of a contact member may be configured to be disposed within the substrate 402 in a through hole 404. In one embodiment, the proximal portions 416 form an interference fit within the through holes 404. The contact members 412 can be deposited into the through holes 404 using a variety of techniques, such as for example stitching or vibratory techniques The substrate 402 of the socket 400 includes a plurality of metal layers oriented parallel to a plane of the substrate 402 and disposed on or within the substrate 402, including a first metal layer 452, a second metal layer 454, and a third metal layer 456. The socket 400 also includes a first conductive sleeve 434 at a first diameter and a second conductive sleeve 458 at a second diameter around a contact member 412.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the invention. The upper and lower limits of these smaller ranges which may independently be included in the smaller ranges is also encompassed within the embodiments of the invention, subject to any specifically excluded limit in the stated range. Where the stated range includes one or both of the limits, ranges excluding either both of those included limits are also included in the embodiments of the invention.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and describe the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the invention are possible. Although the description above contains much specificity, these should not be construed as limiting the scope of the invention, but as merely providing illustrations of some of the presently preferred embodiments of this invention. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the invention. Thus, it is intended that the scope of the present disclosure herein disclosed should not be limited by the particular disclosed embodiments described above.

Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

The invention claimed is:

1. A semiconductor socket comprising:
   a plurality of through holes extending through a substrate from a first surface of the substrate to a second surface of the substrate, each of the plurality of through holes defined by an inner wall of the substrate extending between the first surface and the second surface;
   a conductive material deposited around the inner walls of the plurality of holes to create a plurality of conductive structures;
   at least one dielectric layer deposited on the inner walls and being bonded to the conductive structures: and
   a plurality of discrete contact members disposed in the plurality of the through holes, the plurality of contact members each comprising a proximal end accessible from the second surface, and a distal end extending above the first surface, wherein the conductive structures extend around at least portion of each of the plurality of discrete contact members and the dielectric layer insulating the contact members from the conductive structures.

2. The semiconductor socket of claim 1, wherein the conductive structures comprise conductive sleeves.

3. The semiconductor socket of claim 1, wherein the conductive material comprises electro-less plated metal.

4. The semiconductor socket of claim 3, wherein the conductive structures comprise one of an antennae, and RF connector, or shielding.

5. The semiconductor socket of claim 1, wherein at least one of the plurality of conductive structures uniformly covers the corresponding inner wall of the substrate between the first surface and the second surface of the substrate.

6. The semiconductor socket of claim 1, wherein one or more of the conductive structures are electrically coupled to a ground plane.

7. The semiconductor socket of claim 1, wherein one or more of the conductive structures are electrically coupled to a power plane.

8. The semiconductor socket of claim 1, wherein one or more of the conductive structures are electrically coupled to one of the plurality of contact member.

9. The semiconductor socket of claim 1, wherein the substrate comprises a plurality of layers.

10. The semiconductor socket of claim 1, wherein the substrate comprises a circuitry plane, and wherein the conductive structures are electrically coupled to the circuitry plane.

11. The semiconductor socket of claim 1, further comprising: conductive traces of a circuit geometry redistributing terminal pitch of the proximal ends of the contact members.

12. The semiconductor socket of claim 11, further comprising conductive plating on at least a portion of the conductive traces.

* * * * *